(12) United States Patent
Liao et al.

(10) Patent No.: US 9,063,412 B2
(45) Date of Patent: *Jun. 23, 2015

(54) PHOTOSENSITIVE RESIN COMPOSITION AND APPLICATION OF THE SAME

(71) Applicant: CHI MEI CORPORATION, Tainan (TW)

(72) Inventors: Hao-Wei Liao, Tainan (TW); Ching-Yuan Tseng, Jhongli (TW); Chun-Hsien Lee, Tainan (TW); Ming-Ju Wu, Tainan (TW); Chun-An Shih, Tainan (TW)

(73) Assignee: Chi Mei Corporation, Tainan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/758,177

(22) Filed: Feb. 4, 2013

(65) Prior Publication Data

US 2013/0228727 A1 Sep. 5, 2013

(30) Foreign Application Priority Data

Mar. 1, 2012 (TW) .............................. 101106723 A

(51) Int. Cl.
| | |
|---|---|
| *G02B 5/23* | (2006.01) |
| *G03F 7/004* | (2006.01) |
| *G02B 5/22* | (2006.01) |
| *G03C 1/00* | (2006.01) |
| *G03F 7/00* | (2006.01) |

(52) U.S. Cl.
CPC ..................................... *G03F 7/004* (2013.01)

(58) Field of Classification Search
USPC ........ 252/586; 359/891; 428/447; 430/270.1, 430/280.1, 7, 321; 522/6, 27, 48, 49, 59, 99
See application file for complete search history.

(56) References Cited

U.S. PATENT DOCUMENTS

| | | | | |
|---|---|---|---|---|
| 5,908,720 | A * | 6/1999 | Uchikawa et al. ................. 430/6 |
| 2007/0030667 | A1* | 2/2007 | Watanabe et al. ............... 362/97 |
| 2008/0220372 | A1* | 9/2008 | Lee et al. .................. 430/281.1 |
| 2010/0101843 | A1* | 4/2010 | Wakabayashi et al. ....... 174/258 |
| 2013/0135763 | A1* | 5/2013 | Liao et al. ..................... 359/891 |

FOREIGN PATENT DOCUMENTS

| | | | | |
|---|---|---|---|---|
| JP | 2004-251946 | | 9/2004 | |
| JP | 2008-107529 | * | 5/2008 | ............. G03F 7/075 |
| JP | 2008-116493 | * | 5/2008 | ............. G03F 7/075 |

* cited by examiner

*Primary Examiner* — Bijan Ahvazi
(74) *Attorney, Agent, or Firm* — Jianq Chyun IP Office

(57) ABSTRACT

A photosensitive resin composition includes (A) an alkali-soluble resin, (B) a polysiloxane, (C) an ethylenically unsaturated compound, (D) a photo-initiator, (E) a first solvent, and (F) a black pigment dispersion. The alkali-soluble resin (A) includes an unsaturated-group-containing resin (A-1) obtained by subjecting a mixture containing (i) an epoxy compound having at least two epoxy groups and (ii) a compound having at least one carboxyl group and at least one ethylenically unsaturated group to polymerization. A weight ratio of the black pigment dispersion (F) to the polysiloxane (B) ranges from 5 to 35. Application of the photosensitive resin composition is also disclosed.

19 Claims, No Drawings

PHOTOSENSITIVE RESIN COMPOSITION AND APPLICATION OF THE SAME

CROSS-REFERENCE TO RELATED APPLICATION

This application claims priority of Taiwanese Application No. 1010006723, filed on Mar. 1, 2012.

FIELD OF THE INVENTION

This invention relates to a photosensitive resin composition, more particularly to a photosensitive resin composition for a black matrix of a color filter. This invention also relates to a black matrix formed from the photosensitive resin composition, a color filter including the black matrix, and a liquid crystal display device including the color filter.

BACKGROUND OF THE INVENTION

Description of the Related Art

In order to enhance contrast ratio and display quality of a liquid crystal display device, a black matrix is usually disposed in gaps formed among stripes or dots of a color filter so as to avoid reduction of the contrast radio and color purity due to light leakage among the pixels. A vapor deposited film containing chromium or chromium oxide is used for forming the black matrix. However, there are problems of complicated process, costly material, environmental pollution, etc. Therefore, it has been proposed to form the black matrix using a photosensitive resin composition containing carbon black via photo-lithographic technology. However, the black matrix has poor resistivity due to high conductivity of carbon black.

JP 2004-251946 discloses a photosensitive resin composition with high resistance including an alkali-soluble resin, an ethylenically unsaturated compound, a photo-initiator, a solvent, and a black pigment dispersion including a resin-wrapped carbon black. Through use of the resin-wrapped carbon black, the black matrix formed from the photosensitive resin composition has high resistance. However, the black matrix formed from the photosensitive resin composition may have inferior stability of surface resistance after heat treatment or plasma treatment.

In view of the aforesaid, it is required in the art to provide a photosensitive resin composition for forming a black matrix which has a high light-shielding effect while obtaining superior stability of surface resistance after heat treatment or plasma treatment.

SUMMARY OF THE INVENTION

Therefore, a first object of the present invention is to provide a photosensitive resin composition for forming a black matrix which has superior stability of surface resistance.

A second object of the present invention is to provide a black matrix formed from the photosensitive resin composition.

A third object of the present invention is to provide a color filter including the black matrix.

A fourth object of the present invention is to provide a liquid crystal display device including the color filter.

According to a first aspect of this invention, there is provided a photosensitive resin composition including (A) an alkali-soluble resin, (B) a polysiloxane, (C) an ethylenically unsaturated compound, (D) a photo-initiator, (E) a first solvent, and (F) a black pigment dispersion including a resin-wrapped black pigment component (F-1), a dispersant (F-2), and a second solvent (F-3). The alkali-soluble resin (A) includes an unsaturated-group-containing resin (A-1) obtained by subjecting a mixture containing (i) an epoxy compound having at least two epoxy groups and (ii) a compound having at least one carboxyl group and at least one ethylenically unsaturated group to polymerization. A weight ratio of the black pigment dispersion (F) to the polysiloxane (B) ranges from 5 to 35.

According to a second aspect of this invention, there is provided a black matrix formed from the photosensitive resin composition. The matrix thus formed has a better stability of surface resistance after heat treatment or plasma treatment.

According to a third aspect of this invention, there is provided a color filter including the black matrix having a surface resistance ranging from $10^{14}$ $\Omega/cm^2$ to $10^{17}$ $\Omega/cm^2$.

According to a fourth aspect of this invention, there is provided a liquid crystal display device including the color filter.

DETAILED DESCRIPTION OF THE PREFERRED EMBODIMENTS

As used herein, the term "(meth)acrylic acid" means acrylic acid and/or methacrylic acid. Likewise, the term "(meth)acrylate" means acrylate and/or methacrylate.

The photosensitive resin composition of the present invention includes (A) an alkali-soluble resin, (B) a polysiloxane, (C) an ethylenically unsaturated compound, (D) a photo-initiator, (E) a first solvent, and (F) a black pigment dispersion including a resin-wrapped black pigment component (F-1), a dispersant (F-2), and a second solvent (F-3). The alkali-soluble resin (A) includes an unsaturated-group-containing resin (A-1) obtained by subjecting a mixture containing (i) an epoxy compound having at least two epoxy groups and (ii) a compound having at least one carboxyl group and at least one ethylenically unsaturated group to polymerization. A weight ratio of the black pigment dispersion (F) to the polysiloxane (B) ranges from 5 to 35, preferably from 6 to 32, and more preferably from 7 to 30. When the weight ratio is either lower than 5 or greater than 35, the black matrix formed from the photosensitive resin composition may have inferior stability of surface resistance after heat treatment or plasma treatment.

Photosensitive Resin Composition and Preparation Thereof:

The photosensitive resin composition of the present invention can be made by mixing the alkali-soluble resin (A), the polysiloxane (B), the ethylenically unsaturated compound (C), the photo-initiator (D), the first solvent (E), the black pigment dispersion (F), and optional bridging agent (G) and additives (H) using any of the mixing manners commonly used in the art (for example, using a mixer or a dispersing device) to form a liquid dispersion.

(A) Alkali-Soluble Resin:

The alkali-soluble resin (A) includes the unsaturated-group-containing resin (A-1).

The unsaturated-group-containing resin (A-1) is used in an amount ranging from 30 parts by weight to 100 parts by weight based on 100 parts by weight of the alkali-soluble resin (A). The alkali-soluble resin (A) can optionally include (A-2) another alkali-soluble resin (which will be described in detail hereinafter) other than the unsaturated-group-containing resin (A-1).

(A-1) Unsaturated-Group-Containing Resin:

The unsaturated-group-containing resin (A-1) is obtained by subjecting a mixture containing (i) an epoxy compound having at least two epoxy groups and (ii) a compound having at least one carboxyl group and at least one ethylenically unsaturated group to polymerization. Preferably, the mixture can further contain (iii) an anhydride compound and/or (iv) an epoxy compound other than the epoxy compound (i).

Preferably, the epoxy compound (i) is represented by formula (I):

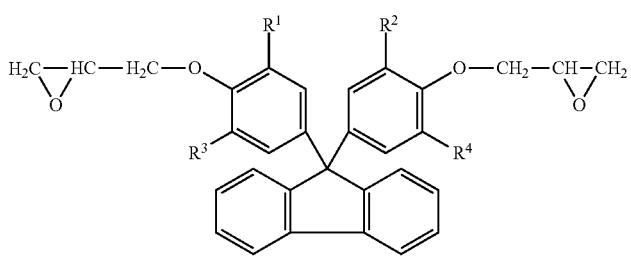

(I)

wherein $R^1$, $R^2$, $R^3$, and $R^4$ are independently selected from the group consisting of hydrogen, halogen, a $C_1$-$C_5$ alkyl group, a $C_1$-$C_5$ alkoxy group, a $C_6$-$C_{12}$ aryl group, and a $C_6$-$C_{12}$ aralkyl group.

Examples of the epoxy compound (i) of formula (I) include, but are not limited to, epoxy-containing bisphenol fluorene, which is obtained by subjecting 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene, 9,9-bis(4-hydroxy-3,5-dibromophenyl)fluorene, or the like and epihalohydrin to a reaction. Examples of the epihalohydrin include, but are not limited to, epichlorohydrin and epibromohydrin. Commercially available examples of epoxy-containing bisphenol fluorene include, but are not limited to, ESF-300 or the like manufactured by Nippon Steel Chemical Group; PG-100, EG-210, or the like manufactured by Osaka Gas; and SMS-F9PhPG, SMS-F9CrG, SMS-F914PG, or the like manufactured by S.M.S. Technology Co.

Preferably, the epoxy compound (i) is represented by formula (II):

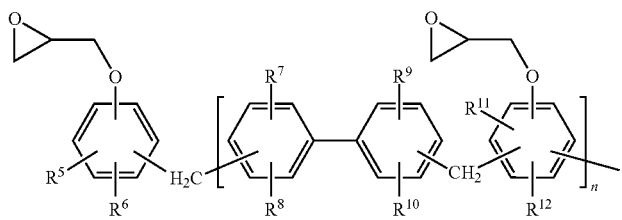

(II)

wherein $R^5$-$R^{18}$ are independently selected from the group consisting of hydrogen, halogen, a $C_1$-$C_8$ alkyl group, and a $C_6$-$C_{15}$ aryl group; and n represents an integer ranging from 0 to 10.

Preferably, the epoxy compound (i) represented by formula (II) is obtained by subjecting a compound represented by formula (III) and epihalohydrin to a reaction in the presence of alkali metal hydroxide.

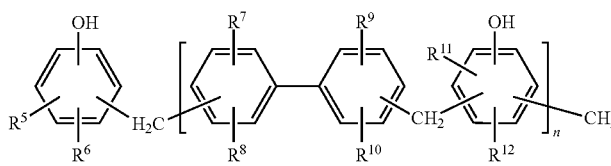

(III)

wherein $R^5$-$R^{18}$ and n are as defined in formula (II).

Preferably, the epoxy compound (i) represented by formula (II) is obtained by subjecting a compound represented by formula (IV) and a phenol compound to a condensation reaction in the presence of an acid catalyst to form the compound represented by formula (III), followed by adding an excess amount of epihalohydrin to conduct a dehydrohalogenation reaction,

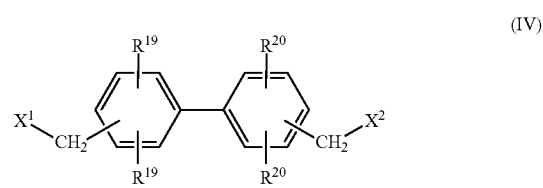

(IV)

wherein $R^{19}$ and $R^{20}$ are independently selected from the group consisting of hydrogen, halogen, a $C_1$-$C_8$ alkyl group, and a $C_6$-$C_{15}$ aryl group; and $X^1$ and $X^2$ are independently selected from the group consisting of halogen (for example, chlorine or bromine), a $C_1$-$C_6$ alkyl group (for example, methyl, ethyl, or t-butyl), and a $C_1$-$C_6$ alkoxy group (for example, methoxy or ethoxy).

Examples of the phenol compound include, but are not limited to, phenol, cresol, ethylphenol, n-propylphenol, isobutylphenol, t-butylphenol, octylphenol, nonylphenol, xylenol, methylbutylphenol, di-t-butylphenol, vinylphenol, propenylphenol, ethinylphenol, cyclopentylphenol, cyclohexylphenol, and cyclohexylcresol. The aforesaid examples of the phenol compound can be used alone or in combinations thereof.

The phenol compound is in an amount ranging preferably from 0.5 mole to 20 moles and more preferably from 2 moles to 15 moles based on 1 mole of the compound represented by formula (IV).

Examples of the acid catalyst include, but are not limited to, hydrochloric acid, sulfuric acid, p-toluenesulfonic acid, oxalic acid, boron trifluoride, aluminium chloride anhydrous, and zinc chloride. Preferably, the acid catalyst is p-toluenesulfonic acid, sulfuric acid, or hydrochloric acid. The aforesaid examples of the acid catalyst can be used alone or in combinations thereof. There is no specific limitation to the amount of the acid catalyst. Preferably, the acid catalyst is in an amount ranging from 0.1 wt % to 30 wt % based on 100 wt % of the compound represented by formula (IV).

The condensation reaction can be conducted in the absence of solvent or in the presence of organic solvent. Examples of the organic solvent include, but are not limited to, toluene, xylene, and methyl isobutyl ketone. The aforesaid examples of the organic solvent can be used alone or in combinations thereof. The organic solvent is in an amount ranging preferably from 50 wt % to 300 wt % and more preferably from 100 wt % to 250 wt % based on 100 wt % of a combination of the compound represented by formula (IV) and the phenol compound. Preferably, the condensation reaction is conducted at a temperature ranging from 40° C. to 180° C. for a period ranging from 1 hour to 8 hours.

After the condensation reaction is completed, neutralization or rinsing treatment can be conducted. The neutralization treatment is conducted using a neutralizing agent to adjust the pH value of the solution after the condensation reaction to a range from 3 to 7, preferably from 5 to 7. The neutralizing agent is a basic material, and examples thereof include, but are not limited to, (1) alkali metal hydroxides, such as sodium hydroxide, and potassium hydroxide; (2) alkaline earth metal hydroxides, such as calcium hydroxide, and magnesium hydroxide; (3) organic amines, such as diethylene triamine, triethylene tetramine, aniline, and phenylene diamine; (4) ammonia and sodium dihydrogen phosphate. The rinsing treatment can be conducted in a commonly used manner. For example, the solution after the condensation reaction is repeatedly extracted using an aqueous solution containing the neutralizing agent. After the neutralization or rinsing treatment is completed, the phenol compound and the solvent remaining in the solution can be removed via heating at reduced pressure and a condensation is conducted to obtain the compound represented by formula (III).

The dehydrohalogenation is then conducted using epihalohydrin, for example, epichlorohydrin, epibromohydrin, or a combination thereof. Preferably, alkaline metal hydroxide, such as sodium hydroxide, potassium hydroxide, and the like, can be added prior to or during the dehydrohalogenation. Preferably, the dehydrohalogenation is conducted at a temperature ranging from 20° C. to 120° C. for a period ranging from 1 hour to 10 hours.

Alkaline metal hydroxide for the dehydrohalogenation can be added in a form of an aqueous solution thereof. In this case, the aqueous solution of alkaline metal hydroxide is continuously added to a reaction system for the dehydrohalogenation, and at the same time, water and epihalohydrin are continuously distilled out of the system at a reduced or normal pressure so as to separate and remove water and to continuously recycle epihalohydrin back to the reaction system.

Dehydrohalogenation is preferably conducted by adding quaternary ammonium salts, such as tetramethyl ammonium chloride, tetramethyl ammonium bromide, trimethyl benzyl ammonium chloride, and the like, as a catalyst in advance and conducting a reaction at a temperature ranging from 50° C. to 150° C. for a period ranging from 1 hour to 5 hours, followed by adding alkaline metal hydroxide or an aqueous solution thereof and further conducting a reaction at a temperature ranging from 20° C. to 120° C. for a period ranging from 1 hour to 10 hours.

Epihalohydrin is used in an amount ranging from 1 mole to 20 moles and preferably from 2 moles to 10 moles based on 1 equivalent weight of the hydroxyl group contained in the compound represented by formula (III). The alkaline metal hydroxide added in dehydrohalogenation is used in an amount ranging from 0.8 mole to 15 moles and preferably from 0.9 mole to 11 moles based on 1 equivalent weight of the hydroxyl group contained in the compound represented by formula (III).

Additionally, an alcohol (for example, methanol, ethanol, and the like) or an aprotic polar solvent (for example, dimethyl sulfone, dimethyl sulfoxide, and the like) can be added to enhance dehydrohalogenation. When alcohol is used, alcohol is in an amount ranging from 2 wt % to 20 wt %, preferably from 4 wt % to 15 wt % based on 100 wt % of epihalohydrin. When the aprotic polar solvent is used, the aprotic polar solvent is in an amount ranging from 5 wt % to 100 wt %, preferably from 10 wt % to 90 wt % based on 100 wt % of epihalohydrin.

In order to avoid the presence of unreacted material such as epihalohydrin in the reaction which may affect the physical properties of the epoxy resin thus formed, a further dehydrohalogenation can be conducted by adding a solvent such as toluene, methyl isobutyl ketone, and the like, followed by adding an aqueous solution of alkali metal hydroxide such as sodium hydroxide, potassium hydroxide, and the like. In the further dehydrohalogenation, the alkali metal hydroxide is in an amount ranging preferably from 0.01 mole to 0.3 mole and more preferably from 0.05 mole to 0.2 mole based on 1 equivalent weight of the hydroxyl group contained in the compound represented by formula (III). Preferably, the further dehydrohalogenation is conducted at a temperature ranging from 50° C. to 120° C. for a period ranging from 0.5 hour to 2 hours.

After dehydrohalogenation is completed, a filtration or rinsing treatment can be optionally conducted, followed by removing epihalohydrin, alcohol, and the aprotic polar solvent by heating at a temperature ranging from 110° C. to 250° C. and a reduced pressure lower than 1.3 kPa (10 mmHg) so as to obtain the epoxy compound (i) represented by formula (II). Commercial examples of the epoxy compound (i) represented by formula (II) include, but are not limited to, NC-3000, NC-3000H, NC-3000S, and NC-3000P manufactured by Nippon Kayaku.

Preferably, the compound (ii) having at least one carboxyl group and at least one ethylenically unsaturated group is selected from (1) acrylic acid, methacrylic acid, 2-methacryloyloxyethylbutanedioic acid, 2-methacryloyloxybutylbutanedioic acid, 2-methacryloyloxyethyladipic acid, 2-methacryloyloxybutyladipic acid, 2-methacryloyloxyethylhexahydrophthalic acid, 2-methacryloyloxyethylmaleic acid, 2-methacryloyloxypropylmaleic acid, 2-methacryloyloxybutylmaleic acid, 2-methacryloyloxypropylbutanedioic acid, 2-methacryloyloxypropyladipic acid, 2-methacryloyloxybutyladipic acid, 2-methacryloyloxypropyltetrahydrophthalic acid, 2-methacryloyloxypropylphthalic acid, 2-methacryloyloxybutylphthalic acid, and 2-methacryloyloxybutylhydrophthalic acid; (2) a compound obtained by subjecting hydroxyl-containing (meth)acrylate and dicarboxylic acid to a reaction; and (3) a hemiester compound obtained by subjecting hydroxyl-containing (meth)acrylate and carboxylic anhydride to a reaction. Examples of the dicarboxylic acid include, but are not limited to, adipic acid, butanedioic acid, maleic acid, and phthalic acid. Examples of the hydroxyl-containing (meth)acrylate include, but are not limited to, (2-hydroxyethyl)acrylate, (2-hydroxyethyl)methacrylate, (2-hydroxypropyl)acrylate, (2-hydroxypropyl)methacrylate, (4-hydroxybutyl)acrylate, (4-hydroxybutyl) methacrylate, and pentaerythritol trimethacrylate. Examples of the carboxylic anhydride are the same as the examples of the anhydride compound (iii) suitable for making the unsaturated-group-containing resin (A-1).

Examples of the anhydride compound (iii) preferably include, but are not limited to, (1) dicarboxylic anhydride: butanedioic anhydride, maleic anhydride, itaconic anhydride, phthalic anhydride, tetrahydrophthalic anhydride, hexahydrophthalic anhydride, methyl tetrahydrophthalic anhydride, methyl hexahydrophthalic anhydride, methyl endo-methylene tetrahydro phthalic anhydride, chlorendic anhydride, glutaric anhydride, and 1,3-dioxoisobenzofuran-5-carboxylic anhydride; (2) tetracarboxylic anhydride: benzophenone tetracarboxylic dianhydride (abbreviated as BTDA), biphenyl tetracarboxylic dianhydride, and diphenyl ether tetracarboxylic dianhydride.

Preferably, the epoxy compound (iv) is selected from glycidyl methacrylate, 3,4-epoxycyclohexyl methacrylate, unsaturated glycidyl ether, unsaturated epoxy compound, and combinations thereof. Commercial examples of the unsaturated glycidyl ether include, but are not limited to, Denacol EX-111, Denacol EX-121, Denacol EX-141, Denacol EX-145, Denacol EX-146, Denacol EX-171, and Denacol EX-192 manufactured by Nagase Chemtex.

The unsaturated-group-containing resin (A-1) can be obtained by subjecting the epoxy compound (i) represented by formula (I) and the compound (ii) having at least one carboxyl group and at least one ethylenically unsaturated group to polymerization to form a hydroxyl-containing product, followed by adding the anhydride compound (iii) to conduct a further reaction. The anhydride group contained in the anhydride compound (iii) is used in an amount ranging preferably from 0.4 equivalent weight to 1 equivalent weight and more preferably from 0.75 equivalent weight to 1 equivalent weight based on 1 equivalent weight of the hydroxyl group contained in the hydroxyl-containing product. When a plurality of the anhydride compounds (iii) are used, they can be added sequentially or simultaneously. When the dicarboxylic anhydride and the tetracarboxylic anhydride are used as the anhydride compound (iii), the molar ratio of the dicarboxylic anhydride to the tetracarboxylic anhydride ranges preferably from 1/99 to 90/10 and more preferably from 5/95 to 80/20. The reaction is conducted at a temperature preferably from 50° C. to 130° C.

Alternatively, the unsaturated-group-containing resin (A-1) can be obtained by subjecting the epoxy compound (i) represented by formula (II) and the compound (ii) having at least one carboxyl group and at least one ethylenically unsaturated group to polymerization to form a hydroxyl-containing product, followed by adding the anhydride compound (iii) and/or the epoxy compound (iv) to conduct a further reaction. The acid value of the compound (ii) is used in an amount ranging preferably from 0.8 equivalent weight to 1.5 equivalent weight and more preferably from 0.9 equivalent weight to 1.1 equivalent weight based on 1 equivalent weight of the epoxy group contained in the epoxy compound (i) represented by formula (II). The anhydride compound (iii) is in an amount ranging generally from 10 mole % to 100 mole %, preferably from 20 mole % to 100 mole %, and more preferably from 30 mole % to 100 mole % based on 100 mole % of the hydroxyl group contained in the hydroxyl-containing product.

In order to enhance the reaction for making the unsaturated-group-containing resin (A-1), a basic compound may be added as a catalyst for the reaction. Examples of the catalyst include, but are not limited to, triphenyl phosphine, triphenyl stibine, triethylamine, triethanolamine, tetramethylammonium chloride, and benzyltriethylammonium chloride. The examples of the catalyst can be used alone or in combinations thereof. The catalyst is in an amount ranging preferably from 0.01 part by weight to 10 parts by weight and more preferably from 0.3 part by weight to 5 parts by weight based on 100 parts by weight of a combination of the epoxy compound (i) and the compound (ii).

Additionally, a polymerization inhibitor can be added to control the degree of polymerization. Examples of the polymerization inhibitor include, but are not limited to, p-methoxyphenol, methylhydroquinone, hydroquinone, 2,6-di-t-butyl-p-cresol, and phenothiazine. The examples of the polymerization inhibitor can be used alone or in combinations thereof. The polymerization inhibitor is in an amount ranging preferably from 0.01 part by weight to 10 parts by weight and more preferably from 0.1 part by weight to 5 parts by weight based on 100 parts by weight of a combination of the epoxy compound (i) and the compound (ii).

A polymerization solvent can be used for making the unsaturated-group-containing resin (A-1), if desired. Examples of the polymerization solvent include, but are not limited to, (1) alcohols: ethanol, propanol, iso-propanol, butanol, iso-butanol, 2-butanol, hexanol, ethylene glycol, and the like; (2) ketones: methyl ethyl ketone, cyclohexyl ketone, and the like; (3) aromatic hydrocarbons: toluene, xylene, and the like; (4) cellosolve compounds: cellosolve, butyl cellosolve, and the like; (5) carbitol compounds: carbitol, butylcarbitol, and the like; (6) propylene glycol alkyl ethers: propylene glycol methyl ether, and the like; (7) poly(propylene glycol) alkyl ethers: di(propylene glycol) methyl ether, and the like; (8) acetates: ethyl acetate, butyl acetate, ethylene glycol monoethyl ether acetate, propylene glycol monomethyl ether acetate, and the like; (9) lactates: ethyl lactate, butyl lactate, and the like; and (10) dialkyl glycol ethers. The aforesaid examples of the polymerization solvent can be used alone or in combinations thereof.

The acid value of the unsaturated-group-containing resin (A-1) ranges preferably from 50 mgKOH/g to 200 mgKOH/g, and more preferably from 60 mgKOH/g to 150 mgKOH/g.

If the unsaturated-group-containing resin (A-1) is not used in the photosensitive resin composition, the black matrix formed from the photosensitive resin composition will have inferior stability of surface resistance after the plasma treatment.

(A-2) Other Alkali-Soluble Resin:

In addition to the aforesaid alkali-soluble resin (A-1), the alkali-soluble resin (A) may include another alkali-soluble resin (A-2) different from the unsaturated-group-containing resin (A-1). The alkali-soluble resin (A-2) is in an amount ranging generally from 0 to 70 parts by weight, preferably from 0 to 50 parts by weight, and more preferably from 0 to 30 parts by weight based on 100 parts by weight of the alkali-soluble resin (A).

Examples of the alkali-soluble resin (A-2) include, but are not limited to, resins containing at least one carboxylic or hydroxyl group, such as acrylic resins other than the unsaturated-group-containing resin (A-1), urethane resins, and novolac resins.

(B) Polysiloxane:

The polysiloxane (B) is in an amount ranging generally from 20 parts by weight to 200 parts by weight, preferably from 25 parts by weight to 180 parts by weight, and more preferably from 30 parts by weight to 150 parts by weight based on 100 parts by weight of the alkali-soluble resin (A).

There is no specific limitation to the structure of the polysiloxane (B). Preferably, the polysiloxane (B) is obtained by subjecting a silane monomer, a siloxane prepolymer, or a combination of a silane monomer and a siloxane prepolymer to conduct hydrolysis and partial condensation.

The silane monomer is preferably represented by Formula (V):

$$SiR^{21}{}_m(OR^{22})_{4-m} \quad (V).$$

m is an integer ranging from 0 to 3.

$R^{21}$ represents hydrogen, a substituted or unsubstituted $C_1$-$C_{10}$ alkyl group, a substituted or unsubstituted $C_2$-$C_{10}$ alkenyl group, or a substituted or unsubstituted $C_6$-$C_{15}$ aryl group. A plurality of $R^{21}$'s are the same or different when m is 2 or 3. Examples of the alkyl group include, but are not limited to, methyl, ethyl, n-propyl, isopropyl, n-butyl, tert-butyl, n-hexyl, n-decyl, trifluoromethyl, 3,3,3-trifluoropropyl, 3-glycidoxy, 2-(3,4-epoxycyclohexyl)ethyl, 3-aminopropyl, 3-mercaptopropyl, 3-isocyanatopropyl, 2-oxetanylbutoxypropyl, 3-glutaric anhydride propyl, 3-butanedioic anhydride propyl, and 2-butanedioic anhydride ethyl. Examples of the alkenyl group include, but are not limited to, vinyl, 3-acryloyloxypropyl, and 3-methacryloyloxypropyl. Examples of the aryl group include, but are not limited to, phenyl, tolyl, p-hydroxyphenyl, 1-(p-hydroxyphenyl)ethyl, 2-(p-hydroxyphenyl)ethyl, 4-hydroxy-5-(p-hydroxyphenylcarbonyloxy)pentyl, and naphthyl.

$R^{22}$ represents hydrogen, a substituted or unsubstituted $C_1$-$C_6$ alkyl group, a substituted or unsubstituted $C_1$-$C_6$ acyl group, or a substituted or unsubstituted $C_6$-$C_{15}$ aryl group. A plurality of $R^{22}$'s are the same or different when 4-m is 2, 3, or 4. Examples of the alkyl group include, but are not limited to, methyl, ethyl, n-propyl, isopropyl, and n-butyl. A non-limiting example of the acyl group is acetyl. A non-limiting example of the aryl group is phenyl.

When m is 0, the silane monomer is tetrafunctional silane. When m is 1, the silane monomer is trifunctional silane. When m is 2, the silane monomer is difunctional silane. When m is 3, the silane monomer is monofunctional silane.

Examples of the silane monomer include, but are not limited to, (1) tetrafunctional silane: tetramethoxysilane, tetraethoxysilane, tetraacetoxysilane, tetraphenoxy silane, and the like; (2) trifunctional silane: methyltrimethoxysilane (abbreviated as MTMS), methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-acryloyloxypropyltrimethoxysilane, 3-acryloyloxypropyltriethoxysilane, 3-methacryloyloxypropyltrimethoxysilane, 3-methacryloyloxypropyltriethoxysilane, phenyltrimethoxysilane (abbreviated as PTMS), phenyltriethoxysilane (abbreviated as PTES), p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 3-mercaptopropyltrimethoxysilane, 2-oxetanylbutoxypropyltriphenoxysilane, commercially available 2-oxetanylbutoxypropyltrimethoxysilane manufactured by Toagosei (trade name: TMSOX), commercially available 2-oxetanylbutoxypropyltriethoxysilane manufactured by Toagosei (trade name: TESOX), 2-trimethoxysilylethyl butanedioic anhydride, 3-triphenoxysilylpropyl butanedioic anhydride, commercially available 3-trimethoxysilylpropyl butanedioic anhydride manufactured by Shin-Etsu (trade name: X-12-967), commercially available 3-triethoxysilylpropyl butanedioic anhydride manufactured by WACKER (trade name: GF-20), 3-trimethoxysilylpropyl glutaric anhydride (abbreviated as TMSG), 3-triethoxysilylpropyl glutaric anhydride, 3-triphenoxysilylpropyl glutaric anhydride, and the like; (3) difunctional silane: dimethyldimethoxysilane (abbreviated as DMDMS), dimethyldiethoxysilane, dimethyldiacetyloxysilane, di-n-butyldimethoxysilane, diphenyldimethoxysilane, diisopropoxy-di(2-oxetanylbutoxypropyl)silane (DIDOS), di(3-oxetanylpentyl)dimethoxysilane, di-[(2-butanedioic anhydride)propyl]di-n-butoxysilane, di-[(2-butanedioic anhydride)ethyl]dimethoxysilane, and the like; and (4) monofunctional silane: trimethylmethoxysilane, tri-n-butylethoxysilane, 3-glycidoxydimethylmethoxysilane, 3-glycidoxydimethylethoxysilane, tri-[(2-butanedioic anhydride)propyl]phenoxysilane, di-[(2-butanedioic anhydride)ethyl](methyl)methoxysilane, and the like. The aforesaid examples of the silane monomer can be used alone or in combinations thereof.

The siloxane prepolymer is preferably represented by Formula (VI):

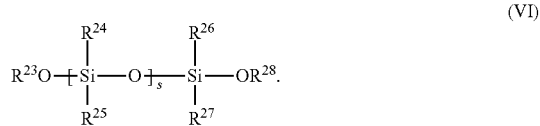

s is an integer ranging preferably from 1 to 1,000 and more preferably from 5 to 200.

$R^{24}$, $R^{25}$, $R^{26}$, and $R^{27}$ respectively represent hydrogen, a substituted or unsubstituted $C_1$-$C_{10}$ alkyl group, a substituted or unsubstituted $C_2$-$C_6$ alkenyl group, or a substituted or unsubstituted $C_6$-$C_{15}$ aryl group. A plurality of $R^{24}$'s are the same or different and a plurality of $R^{25}$'s are the same or different when s is from 2 to 1,000. Examples of the alkyl group include, but are not limited to, methyl, ethyl, and n-propyl. Examples of the alkenyl group include, but are not limited to, vinyl, acryloyloxypropyl, and methacryloyloxypropyl. Examples of the aryl group include, but are not limited to, phenyl, tolyl, and naphthyl.

$R^{23}$ and $R^{28}$ respectively represent hydrogen, a substituted or unsubstituted $C_1$-$C_6$ alkyl group, a substituted or unsubstituted $C_1$-$C_6$ acyl group, or a substituted or unsubstituted $C_6$-$C_{15}$ aryl group. Examples of the alkyl group include, but are not limited to, methyl, ethyl, n-propyl, isopropyl, and n-butyl. A non-limiting example of the acyl group is acetyl. A non-limiting example of the aryl group is phenyl.

Examples of the siloxane prepolymer include, but are not limited to, 1,1,3,3-tetramethyl-1,3-dimethoxydisiloxane, 1,1,3,3-tetraethyl-1,3-diethoxydisiloxane, and commercially available silanol-terminated polysiloxanes manufactured by Gelest Inc. (for example, DM-S12 (molecular weight: 400-700), DMS-S15 (molecular weight: 1,500-2,000), DMS-S21 (molecular weight: 4,200), DMS-S27 (molecular weight: 18,000), DMS-S31 (molecular weight:26,000), DMS-S32 (molecular weight: 36,000), DMS-S33 (molecular weight:

43,500), DMS-S35 (molecular weight: 49,000), DMS-S38 (molecular weight: 58,000), DMS-S42 (molecular weight: 77,000), PDS-9931 (molecular weight: 1,000-1,400), and the like). The aforesaid examples of the siloxane prepolymer can be used alone or in combinations thereof.

When the silane monomer and the siloxane prepolymer are used in combination, there is no specific limitation to the mixing ratio thereof. Preferably, the molar ratio of the Si atom of the silane monomer to that of the siloxane prepolymer ranges from 100:0.01 to 50:50.

Alternatively, polysiloxane can be prepared via copolymerization by mixing the silane monomer and/or siloxane prepolymer with silicon dioxide particles. There is no specific limitation to the mean particle size of the silicon dioxide particles. The mean particle size of the silicon dioxide particles ranges generally from 2 nm to 250 nm, preferably from 5 nm to 200 nm, and more preferably from 10 nm to 100 nm.

Examples of the silicon dioxide particles include commercially available products manufactured by Catalysts and Chemicals Ltd., for example, OSCAR 1132 (particle size: 12 nm, dispersing agent: methanol), OSCAR 1332 (particle size: 12 nm, dispersing agent: n-propanol), OSCAR 105 (particle size: 60 nm, dispersing agent: γ-butyrolactone), OSCAR 106 (particle size: 120 nm, dispersing agent: diacetone alcohol), and the like; commercially available products manufactured by Fuso Chemical Co., Ltd., for example, Quartron PL-1-IPA (particle size: 13 nm, dispersing agent: isopropanone), Quartron PL-1-TOL (particle size: 13 nm, dispersing agent: phenol), Quartron PL-2L-PGME (particle size: 18 nm, dispersing agent: propylene glycol monomethyl ether), Quartron PL-2L-MEK (particle size: 18 nm, dispersing agent: methyl ethyl ketone), and the like; commercially available products manufactured Nissan Chemical, for example, IPA-ST (particle size: 12 nm, dispersing agent: isopropanol), EG-ST (particle size: 12 nm, dispersing agent: ethylene glycol), IPA-ST-L (particle size: 45 nm, dispersing agent: isopropanol), IPA-ST-ZL (particle size: 100 nm, dispersing agent: isopropanol), and the like. The aforesaid examples of the silicon dioxide particles can be used alone or in combinations thereof.

When the silicon dioxide particles are mixed with the silane monomer and/or the siloxane prepolymer, there is no specific limitation to the amounts thereof. Preferably, the molar ratio of the Si atom of the silicon dioxide particles to that of the silane monomer and/or the siloxane prepolymer ranges from 1% to 50%.

The hydrolysis and the partial condensation can be conducted in a manner well known in the art. For example, the mixture of the silane monomer and/or the siloxane prepolymer and/or the silicon dioxide particles is added with solvent, water, and optionally catalyst, followed by stirring at a temperature ranging from 50° C. to 150° C. for 0.5 hour to 120 hours. The by-products, such as alcohols and water, can be removed by distillation if necessary.

There is no specific limitation to the solvent, which can be the same as or different from the first solvent (E) contained in the photosensitive resin composition. Preferably, the solvent is added in an amount ranging generally from 15 g to 1200 g, preferably from 20 g to 1100 g, and more preferably from 30 g to 1000 g based on 100 g of a combination of the silane monomer and the siloxane prepolymer.

The amount of water for the hydrolysis ranges from 0.5 mole to 2 moles based on 1 mole of the hydrolysable groups contained in the mixture.

There is no specific limitation to the catalyst. Preferably, the examples of the catalyst include acidic catalyst, for example, hydrochloric acid, nitric acid, sulfuric acid, hydrofluoric acid, oxalic acid, phosphoric acid, acetic acid, trifluoroacetic acid, formic acid, polycarboxylic acid and anhydride thereof, ionic exchange resin, and the like; and basic catalyst, for example, diethylamine, triethylamine, tripropylamine, tributylamine, tripentylamine, trihexylamine, triheptylamine, trioctylamine, diethanolamine, triethanolamine, sodium hydroxide, potassium hydroxide, alkoxysilane containing an amino group, ionic exchange resin, and the like.

Preferably, the catalyst is added in an amount ranging generally from 0.005 g to 15 g, preferably from 0.01 g to 12 g, and more preferably from 0.05 g to 10 g based on 100 g of a combination of the silane monomer and the siloxane prepolymer.

In view of safety, it is preferable that the by-products (for example, alcohols or water) and the catalyst are not contained in the polysiloxane (B) produced by the hydrolysis and the partial condensation. Therefore, it is preferable to purify the polysiloxane (B). There is no specific limitation to the purification method. Preferably, the polysiloxane (B) is diluted with hydrophobic solvent, and the separated organic layer is washed several times with water and is then condensed with an evaporator to remove alcohols and water. Alternatively, the catalyst can be removed using ion exchange resin.

A weight ratio of the unsaturated-group-containing resin (A-1) to the polysiloxane (B) ranges from 0.5 to 4.2, preferably from 0.8 to 4.0, and more preferably from 1.0 to 3.8. The black matrix made from the photosensitive resin composition has better stability of surface resistance after plasma treatment when the weight ratio of the unsaturated-group-containing resin (A-1) to the polysiloxane (B) ranges from 0.5 to 4.2.

The black matrix made from the photosensitive resin composition has unstable surface resistance after heat or plasma treatment when the polysiloxane (B) is not used to make the photosensitive resin composition for forming the black matrix.

(C) Ethylenically Unsaturated Compound:

The ethylenically unsaturated compound (C) is in an amount ranging generally from 2 parts by weight to 220 parts by weight, preferably from 10 parts by weight to 200 parts by weight, and more preferably from 15 parts by weight to 180 parts by weight based on 100 parts by weight of the alkali-soluble resin (A).

Preferably, the ethylenically unsaturated compound (C) is selected from (C-1) a compound having one ethylenically unsaturated group, and (C-2) a compound having two or more ethylenically unsaturated groups.

Examples of the compound (C-1) include, but are not limited to, acrylamide, acryloylmorpholine, methacryloyl morpholine, 7-amino-3,7-dimethyl octyl acrylate, 7-amino-3,7-dimethyl octyl methacrylate, iso-butoxy methyl acrylamide, iso-butoxy methyl methacrylamide, iso-bornyloxyethyl acrylate, iso-bornyloxyethyl methacrylate, iso-bornyl acrylate, iso-bornyl methacrylate, 2-ethylhexyl acrylate, 2-ethylhexyl methacrylate, ethyl diethylene glycol acrylate, ethyl diethylene glycol methacrylate, t-octyl acrylamide, t-octyl methacrylamide, diacetone acrylamide, diacetone methacrylamide, dimethyl aminoethyl acrylate, dimethyl aminoethyl methacrylate, dodecyl acrylate, dodecyl methacrylate, dicyclopentenyloxyethyl acrylate, dicyclopentenyloxyethyl methacrylate, dicyclopentenyl acrylate, dicyclopentenyl methacrylate, N,N-dimethyl acrylamide, N,N-dimethyl methacrylamide, tetrachlorophenyl acrylate, tetrachlorophenyl methacrylate, 2-tetrachlorophenoxyethyl acrylate, 2-tetrachlorophenoxyethyl methacrylate, tetrahydrofurfuryl acrylate, tetrahydrofurfuryl methacrylate, tetrabromophenyl acrylate, tetrabromophenyl methacrylate, 2-tetrabromophenoxyethyl acrylate, 2-tetrabromophenoxyethyl methacrylate, 2-trichlorophenoxy ethyl acrylate, 2-trichlorophenoxy ethyl methacrylate, tribromophenyl acrylate, tribromophenyl methacrylate, 2-tribromophenoxy ethyl acrylate, 2-tribromophenoxy ethyl methacrylate, 2-hydroxyethyl acrylate, 2-hydroxyethyl methacrylate, 2-hydroxypropyl acrylate, 2-hydroxypropyl methacrylate, vinyl caprolactam, N-vinyl pyrrolidone, phenoxy ethyl acrylate, phenoxy ethyl methacrylate, pentachlorophenyl acrylate, pentachlorophenyl methacrylate, pentabromophenyl acrylate, pentabromophenyl methacrylate, polyethylene glycol monoacrylate, polyethylene glycol monomethacrylate, polypropylene glycol monoacrylate, polypropylene glycol monomethacrylate, bornyl acrylate, and bornyl methacrylate. The aforesaid examples of the compound (C-1) can be used alone or in admixture of two or more.

Examples of the compound (C-2) include, but are not limited to, ethylene glycol diacrylate, ethylene glycol dimethacrylate, dicyclopentenyl diacrylate, dicyclopentenyl dimethacrylate, triethylene glycol diacrylate, tetraethylene glycol diacrylate, tetraethylene glycol dimethacrylate, tri(2-hydroxyethyl)isocyanurate diacrylate, tri(2-hydroxyethyl)isocyanurate dimethacrylate, tri(2-hydroxyethyl)isocyanurate triacrylate, tri(2-hydroxyethyl)isocyanurate trimethacrylate, caprolactone-modified tri(2-hydroxyethyl) isocyanurate triacrylate, caprolactone-modified tri(2-hydroxyethyl)isocyanurate trimethacrylate, trimethylolpropyl triacrylate, trimethylolpropyl trimethacrylate, ethylene oxide (hereinafter abbreviated as EO) modified trimethylolpropyl triacrylate, EO-modified trimethylolpropyl trimethacrylate, propylene oxide (hereinafter abbreviated as PO) modified trimethylolpropyl triacrylate, PO-modified trimethylolpropyl trimethacrylate, tripropylene glycol diacrylate, tripropylene glycol dimethacrylate, neo-pentyl glycol diacrylate, neo-pentyl glycol dimethacrylate, 1,4-butanediol diacrylate, 1,4-butanediol dimethacrylate, 1,6-hexanediol diacrylate, 1,6-hexanediol dimethacrylate, pentaerythritol triacrylate, pentaerythritol trimethacrylate, pentaerythritol tetraacrylate, pentaerythritol tetramethacrylate, polyester diacrylate, polyester dimethacrylate, polyethylene glycol diacrylate, polyethylene glycol dimethacrylate, dipentaerythritol hexaacrylate (DPHA), dipentaerythritol hexamethacrylate, dipentaerythritol pentaacrylate, dipentaerythritol pentamethacrylate, dipentaerythritol tetraacrylate, dipentaerythritol tetramethacrylate, caprolactone-modified dipentaerythritol hexaacrylate, caprolactone-modified dipentaerythritol hexamethacrylate, caprolactone-modified dipentaerythritol pentaacrylate, caprolactone-modified dipentaerythritol pentamethacrylate, ditrimethylolpropyl tetraacrylate, ditrimethylolpropyl tetramethacrylate, EO-modified bisphenol A diacrylate, EO-modified bisphenol A dimethacrylate, PO-modified bisphenol A diacrylate, PO-modified bisphenol A dimethacrylate, EO-modified hydrogenated bisphenol A diacrylate, EO-modified hydrogenated bisphenol A dimethacrylate, PO-modified hydrogenated bisphenol A diacrylate, PO-modified hydrogenated bisphenol A dimethacrylate, PO-modified glycerol triacrylate, EO-modified bisphenol F diacrylate, EO-modified bisphenol F dimethacrylate, phenol novolac polyglycidyl ether acrylate, and phenol novolac polyglycidyl ether methacrylate. The aforesaid examples of the compound (C-2) can be used alone or in admixture of two or more.

Preferably, the ethylenically unsaturated compound (C) is selected from trimethylolpropyl triacrylate, EO-modified trimethylolpropyl triacrylate, PO-modified trimethylolpropyl triacrylate, pentaerythritol triacrylate, pentaerythritol tetraacrylate, dipentaerythritol hexaacrylate, dipentaerythritol pentaacrylate, dipentaerythritol tetraacrylate, caprolactone-modified dipentaerythritol hexaacrylate, ditrimethylolpropyl tetraacrylate, PO-modified glycerol triacrylate, and combinations thereof.

(D) Photo-Initiator:

The photo-initiator (D) is in an amount ranging generally from 2 parts by weight to 120 parts by weight, more preferably from 5 parts by weight to 100 parts by weight, and more preferably from 10 parts by weight to 80 parts by weight based on 100 parts by weight of the ethylenically unsaturated compound (C).

Examples of the photo-initiator (D) suitable for the present invention include, but are not limited to, oxime compounds (D-1), acetophenone compounds (D-2), other photo-initiators (D-3), and combinations thereof.

Examples of the oxime compounds (D-1) include, but are not limited to, ethanone,1-[9-ethyl-6-(2-methylbenzoyl)9H-carbazole-3-yl]-,1-(O-acetyloxime) (for example, OXE02 manufactured by Ciba Specialty Chemicals), ethanone,1-[9-ethyl-6-(2-chloro-4-benzylsulfonyl benzoyl) 9H-carbazole-3-yl]-1-(O-acetyl oxime) (manufactured by Asahi Denka Co., Ltd.), 1-(4-phenyl-thiophenyl)-butane-1,2-dione 2-oxime-O-benzoate, 1-(4-phenyl-thiophenyl)-octane-1,2-dione 2-oxime-O-benzoate (for example, OXE01 manufactured by Ciba Specialty Chemicals), 1-(4-phenyl-thiophenyl)-octane-1-one oxime-O-acetate, and 1-(4-phenyl-thiophenyl)-butane-1-one oxime-O-acetate. The aforesaid examples of the oxime compounds (D-1) can be used alone or in combinations thereof.

Examples of the acetophenone compounds (D-2) include, but are not limited to, p-dimethylaminoacetophenone, α,α'-dimethoxyazoxyacetophenone, 2,2'-dimethyl-2-phenylacetophenone, p-methoxyacetophenone, 2-methyl-1-(4-methylthiophenyl)-2-morpholino-1-propan one, and 2-benzyl-2-N,N-dimethylamino-1-(4-morpholinophenyl)-1-butanone. The aforesaid examples of the acetophenone compounds (D-2) can be used alone or in combinations thereof. Preferably, the acetophenone compound (D-2) is selected from 2-methyl-1-(4-methylthiophenyl)-2-morpholino-1-propan one and 2-benzyl-2-N,N-dimethylamino-1-(4-morpholinophenyl)-1-butanone.

Examples of other photo-initiators (D-3) include, but are not limited to, (1) biimidazole compounds: 2,2'-bis(o-chlorophenyl)-4,4',5,5'-tetraphenylbiimidazole, 2,2'-bis(o-fluorophenyl)-4,4',5,5'-tetraphenylbiimidazole, 2,2'-bis(o-methylphenyl)-4,4',5,5'-tetraphenylbiimidazole, 2,2'-bis(o-methoxyphenyl)-4,4',5,5'-tetraphenylbiimidazole, 2,2'-bis(p-methoxyphenyl)-4,4',5,5'-tetraphenylbiimidazole, 2,2'-bis(2,2',4,4'-tetramethoxyphenyl)-4,4',5,5'-tetraphenylbiimidazole, 2,2'-bis(2,4-dichlorophenyl)-4,4',5,5'-tetraphenylbiimidazole, and the like; (2) benzophenone compounds: thioxanthone, 2,4-diethylthioxanthone, thioxanthone-4-sulfone, benzophenone, 4,4'-bis(dimethylamino) benzophenone, 4,4'-bis(diethylamino)benzophenone, and the like; (3) α-diketone compounds: benzil, acetyl, and the like; (4) acyloin compounds: benzoin, and the like; (5) acyloin ether compounds: benzoin methyl ether, benzoin ethyl ether, benzoin isopropyl ether, and the like; (6) acylphosphine oxide compounds: 2,4,6-trimethylbenzoyl phenylphosphine oxide, bis-(2,6-dimethoxybenzoyl)-2,4,4-trimethyl benzyl phosphine oxide, and the like; (7) quinone compounds: anthraquinone, 1,4-naphthoquinone, and the like; (8) halide compounds, such as phenacyl chloride, tribromomethyl phenylsulfone, tris (trichloromethyl)-s-triazine, and the like; (9) peroxide compounds: di-tert-butyl peroxide, and the like; and (10) any combinations of the aforesaid compounds (1)-(9). The aforesaid examples of other photo-initiators (D-3) can be used alone or in combinations thereof.

(E) First Solvent:

The first solvent (E) used in this invention is preferably capable of dissolving the alkali-soluble resin (A), the ethylenically unsaturated compound (C), and the photo-initiator (D) and will not interact with these components. The solvent is preferably volatile.

The first solvent (E) is used in an amount ranging generally from 300 parts by weight to 3,000 parts by weight, preferably from 500 parts by weight to 2,800 parts by weight, and more preferably from 700 parts by weight to 2,600 parts by weight based on 100 parts by weight of the alkali-soluble resin (A).

Examples of the first solvent (E) include, but are not limited to, (1) alkylene glycol monoalkyl ether compounds: ethylene glycol monomethyl ether, ethylene glycol monoethyl ether, diethylene glycolmonoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, and the like; (2) alkylene glycol monoalkyl ether acetate compounds: ethylene glycol monomethyl ether acetate, ethylene glycol monoethyl ether acetate, propylene glycol monomethyl ether acetate, propylene glycol monoethyl ether acetate, and the like; (3) other ether compounds: diethylene glycol dimethyl ether, diethylene glycol methyl ethyl ether, diethylene glycol diethyl ether, tetrahydrofuran, and the like; (4) ketone compounds: methyl ethyl ketone, cyclohexanone, 2-heptanone, 3-heptanone, diacetone alcohol, and the like; (5) alkyl lactate compounds: methyl 2-hydroxypropionate, ethyl 2-hydroxypropionate, and the like; (6) other ester compounds: methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutyrate, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl acetate, i-pentyl acetate, n-butyl propionate, ethyl butyrate, n-propyl butyrate, i-propyl butyrate, n-butyl butyrate, methyl pyrutate, ethyl pyrutate, n-propyl pyrutate, methyl acetoacetate, ethyl acetoacetate, ethyl 2-oxybutyrate, and the like; (7) aromatic hydrocarbon compounds: toluene, xylene, and the like; (8) amide compounds: N-methylpyrrolidone, N,N-dimethylformamide, N,N-dimethylacetamide, and the like; and (9) any combinations of the aforesaid compounds (1)-(8). The aforesaid examples of the solvent (E) can be used alone or in combinations thereof.

(F) Black Pigment Dispersion:

The black pigment dispersion (F) is used in an amount ranging generally from 300 parts by weight to 1,500 parts by weight, preferably from 400 parts by weight to 1,400 parts by weight, and more preferably from 500 parts by weight to 1,300 parts by weight based on 100 parts by weight of the alkali-soluble resin (A).

The black pigment dispersion (F) includes a resin-wrapped black pigment component (F-1), a dispersant (F-2), and a second solvent (F-3). The dispersant (F-2) is used in an amount ranging from 2 parts by weight to 50 parts by weight, preferably from 3 parts by weight to 45 parts by weight, and more preferably from 5 parts by weight to 40 parts by weight based on 100 parts by weight of the resin-wrapped black pigment component (F-1). The second solvent (F-3) is used in an amount ranging from 2 parts by weight to 500 parts by weight, preferably from 5 parts by weight to 450 parts by weight, and more preferably from 10 parts by weight to 400 parts by weight based on 100 parts by weight of the resin-wrapped black pigment component (F-1).

If a conventional black pigment rather than the resin-wrapped black pigment component (F-1) is used in the photosensitive resin composition, the black pigment is not capable of electrical insulation, and is not easily wrapped by the unsaturated-group-containing resin (A-1) and the polysiloxane (B). The black matrix thus formed has relatively low resistance, and has inferior stability of surface resistance after the plasma treatment.

The black pigment dispersion (F) is prepared by mixing manners commonly used in the art, for example, the resin-wrapped black pigment component (F-1), the dispersant (F-2), and the second solvent (F-3) are put together followed by addition of media, such as glass bead or zirconia bead and finally mixed by a paint conditioner, a ball mill, a sand grinder, a twin-roll mill, a three-roll mill, a homogenizer, a jet mill, or ultrasonic treatment.

A well-known laser Doppler type granulometer is used to measure the average particle size of the resin-wrapped black pigment component (F-1) in the black pigment dispersion (F). The measured average particle size of the resin-wrapped black pigment component (F-1) in the black pigment dispersion (F) ranges from 80 nm to 300 nm, preferably from 80 nm to 200 nm. When the particle size is greater than 300 nm, there are bad influences on surface roughness and pattern of the black matrix formed from the black pigment dispersion (F). When the particle size is smaller than 80 nm, there are clogging problems during filtering process.

Viscosity of the black pigment dispersion (F) is measured by a well-known cone-and-plate viscometer at 25° C. The viscosity of the black pigment dispersion (F) ranges from 3.0 mPa·s to 200.0 mPa·s, preferably from 3.0 mPa·s to 100.0 mPa·s, and more preferably from 3.0 mPa·s to 30.0 mPa·s.

(F-1) Resin-Wrapped Black Pigment Component:

The resin-wrapped black pigment component (F-1) is made from a mixture including a black pigment, a resin for covering the black pigment, and a third solvent. The resin for covering the black pigment is used in an amount ranging from 10 parts by weight to 50 parts by weight, preferably from 15 parts by weight to 45 parts by weight, and more preferably from 20 parts by weight to 40 parts by weight based on 100 parts by weight of the black pigment. The third solvent is used in an amount ranging from 150 parts by weight to 400 parts by weight, preferably from 180 parts by weight to 380 parts by weight, and more preferably from 200 parts by weight to 350 parts based on 100 parts by weight of the black pigment.

There is no specific limitation on preparing the resin-wrapped black pigment component (F-1). For example, a resin is dissolved in a solvent, such as cyclohexanone, toluene, or xylene to form a resin solution, and a black pigment is dispersed in water to form a suspension, followed by mixing the resin solution with the suspension. After the black pigment and the water are separated, the water is removed and a mixing treatment is conducted under heating to form the resin-wrapped black pigment component (F-1), which can be optionally formed into flakes followed by grinding and drying.

Preferably, the mixture also includes a curing agent. The curing agent is used in an amount ranging from 0.5 part by weight to 10 parts by weight, preferably from 1 part by weight to 8 parts by weight, and more preferably from 2 parts by weight to 5 parts by weight based on 100 parts by weight of the black pigment.

Black Pigment

The black pigment used in this invention is desired to have good properties including heat resistance, light resistance and solvent resistance. Examples of the black pigment include, but are not limited to, (1) organic black pigment: perylene black, cyanine black, aniline black, and the like; (2) a black-like admixture of two or more pigments selected from red, blue, green, purple, yellow, cyanine, and magenta pigments, and the like; and (3) light-shielding materials, such as carbon black, chromium oxide, ferric oxide, titanium black, graphite, and the like. The aforesaid examples of the black pigment can be used alone or in combinations thereof.

Preferably, the black pigment is carbon black. The carbon black has a total oxygen amount of 15 mg/g or above and a ratio of a total oxygen amount to specific surface area is equal to or above $0.1$ mg/m$^2$. The carbon black preferably has an ash amount less than 1.0 wt % and a dibutyl phthalate absorption amount less than 140 ml/100 g.

The surface of the carbon black has oxygen-containing functionalities including hydroxyl (—OH), carbonyl, carboxyl (—COOH) and the like. Generally, the amount of the oxygen-containing functionality is measured from volatile components, such as carbon monoxide or carbon dioxide. Specifically, the amount of hydroxyl and carbonyl is measured from carbon monoxide while the amount of carboxyl is measured from carbon dioxide. The total oxygen amount is calculated from carbon monoxide and carbon dioxide. The total oxygen amount of the carbon black is preferably above 20 mg/g, and the ratio of the total oxygen amount to the specific surface area is preferably above $0.15$ mg/m$^2$. The aforesaid volatile components and specific surface area are measured according the method described in JP 9-124969.

When the ash content is above 1.0 wt %, because the ash includes alkali and/or alkali earth elements, such as sodium, calcium, potassium, and the like which tend to absorb water, the resin-wrapped black pigment component (F-1) will have increased water absorption and the insulation thereof will be reduced. The amount of the ionic conductive material can be reduced by checking crude oil for the production of the carbon black, spray water for quenching, and additives. The amount of the ionic conductive material can also be reduced by rinsing or acid pickling. A combination of the abovementioned manners can be used. The amount of the ionic conductive material in the carbon black is denoted by ash residue content after sintering the carbon black at 750° C. for 4 hours to 6 hours in air.

When the dibutyl phthalate (DBP) absorption amount measured according to JIS-K6221-A is larger than 140 ml/100 g, the carbon black has lower blackness and the resin-wrapped black pigment component (F-1) has higher viscosity, which results in low surface uniformity of the black matrix. Preferably, the DBP absorption amount of the carbon black is lower than 120 ml/100 g. The carbon black has a primary particle size ranging from 15 nm to 150 nm, preferably from 20 nm to 120 nm. A non-limiting example of the carbon black is C.I. pigment black 7. Commercially available examples of the carbon black include MA100, MA220, MA230, MA8, #970, #1000, #2350, and #2650 manufactured by Mitsubishi Chemical Corporation.

Resin for Wrapping Black Pigment

The resin for wrapping the black pigment enables the resin-wrapped black pigment component (F-1) to have good properties including heat resistance, dispersibility and electrical resistance. Examples of the resin for wrapping the black pigment include, but are not limited to, phenolic resin, melamine resin, xylene resin, diallyl phthalate resin, glyptal resin, epoxy resin, cardo resin, alkylbenzene resin, polystyrene, polycarbonate, polyethylene terephthalate, polybutylene terephthalate, modified polyphenylene oxide, polysulfone, poly(para-phenylene terephthalamide), polyamide imide, polyimide, polyaminobismaleimide, polyethersulfon-polyphenylenesulfonate, polyarylate, and polyether etherketone.

Preferable, the resin for wrapping the black pigment is epoxy resin. Examples of the epoxy resin include, but are not limited to, (1) epoxy resin of glycidyl amine, (2) epoxy resin of triphenyl glycidyl methane, (3) epoxy resin of tetraphenyl glycidyl methane, (4) epoxy resin of aminophenol, (5) epoxy resin of diamide diphenylmethane, (6) epoxy resin of phenol novolac, (7) epoxy resin of ortho-cresol, and (8) epoxy resin of bisphenol A novolac. Examples of the epoxy resin can be used alone or in combinations thereof.

Commercially available examples of the epoxy resin of glycidyl amine include, but are not limited to, Sumiepoxy ELM-434, ELM-120, and ELM-100 manufactured by Sumitomo Chemical Co., Ltd. Commercially available examples of the epoxy resin of triphenyl glycidyl methane include, but are not limited to, EPIKOTE 1032H60, and EPIKOTE 1032H50 manufactured by Yuka Shell Epoxy Co., Ltd. A non-limiting example of commercially available epoxy resin of tetraphenyl glycidyl methane is EPIKOTE 1031. Commercially available examples of the epoxy resin of aminophenol include, but are not limited to, EPIKOTE 154 and EPIKOTE 630. A non-limiting example of commercially available epoxy resin of diamide diphenylmethane is EPIKOTE 604. A non-limiting example of commercially available epoxy resin of phenol novolac is EPIKOTE 152. A non-limiting example of commercially available epoxy resin of ortho-cresol is EPIKOTE 180565. Commercially available examples of the epoxy resin of bisphenol A novolac include, but are not limited to, EPIKOTE 157S65, EPIKOTE 157S70, and EPIKOTE 828.

Curing Agent

The curing agent is used to adjust inherent bulk resistivity and surface properties of the black pigment which gives the resin-wrapped black pigment component (F-1) good properties including electrical resistivity and heat resistivity.

There is no specific limitation to the types of the curing agent as long as the resin-wrapped black pigment component (F-1) can be provided with electrical resistivity and heat resistivity. Examples of the curing agent include, but are not limited to, anhydride, imidazole, and boron trifluoride complex. Considering reaction rate, the curing agent is preferably imidazole compound due to its ability to react at low temperature and fast curing rate.

Examples of the imidazole compound include, but are not limited to, 2-methylimidazole, 2-ethyl-4-methylimidazole (abbreviated as EMMI), 2-undecylimidazole, 2-heptadecylimidazole, 2-phenylimidazole (abbreviated as PIM), 1-benzyl-2-methylimidazole, 1-cyanoethyl-2-methylimidazole, and 2,4-diamino-6-(2-methylimidazole-(1))-ethyl-s-triazine. Examples of the imidazole compound can be used alone or in combinations thereof.

Third Solvent

The third solvent is the same as the above-mentioned first solvent (E).

(F-2) Dispersant

There is no specific limitation to the types and amounts of the dispersant (F-2) so long as it can be dissolved in the second solvent (F-3) and allows the resin-wrapped black pigment component (F-1) to have dispersion stability.

Examples of the dispersant (F-2) include, but are not limited to, (1) organic solvent dispersant: polyurethane, polyacrylate, hydroxyl-containing polycarboxylate (or modification thereof), unsaturated polyamide, (partial) amine salt of polycarboxylic acid, ammonium salt of polycarboxylic acid, alkylamine salt of polysiloxane, long-chain polyaminoamide phosphate, amide or its ester formed by a reaction of poly (alkylene imine) with polyester having a free carboxylic group, and the like; (2) aqueous dispersant: water soluble resin and water soluble polymeric compound, such as (meth) acrylic acid-styrene copolymer, (meth) acrylic acid-(meth) acrylate copolymer, styrene-cis-butenedioic acid copolymer, polyvinyl alcohol, polyvinyl pyrrolidone, and the like; (3) anion surfactant: lauryl sodium sulfate, polyoxyethylene alkyl ether sulfate, sodium dodecyl benzene sulfonate, alkali salt of styrene-acrylic acid copolymer, sodium stearate, sodium alkyl naphthalene sulfonate, sodium alkyl diphenyl oxide disulfonate, monoethanolamine lauryl sulfate, triethanolamine lauryl sulfate, ammonium lauryl sulfate, monoethanolamine stearate, sodium lauryl sulfate, monoethanolamine of styrene-acrylic acid copolymer, polyoxyethylene alkyl ether phosphate ester, and the like; (4) non-ionic surfactant: polyoxyethylene oleyl alcohol ether, polyoxyethylene lauryl ether, polyoxyethylene nonyl phenyl ether, polyoxyethylene alkyl ether phosphate, polyoxyethylene sorbitan monostearate, polyethylene glycol monolaurate, and the like; and (5) amphoteric surfactant: alkyl betaine (such as alkyl dimethylamine acetate betaine), alkyl imidazoline, and the like. Examples of the dispersant (F-2) can be used alone or in combinations thereof.

Preferably, the dispersant (F-2) is an amino-containing dispersant. The amino-containing dispersant enables the resin-wrapped black pigment component (F-1) to have better dispersive property, enhanced electrical insulation and tinting strength, and can form the black matrix with high light-shielding effect and low surface reflectivity.

Commercially available examples of the amino-containing dispersant include, but are not limited to, Solsperse series, such as SOLSPERSE 13240, SOLSPERSE 13940, SOLSPERSE 17000, SOLSPERSE24000GR, SOLSPERSE 28000, SOLSPERSE 20000, SOLSPERSE 12000, OLSPERSE 27000, and the like, manufactured by Avecia Biotechnology Inc.; Disperbyk series, such as Disperbyk-130, Disperbyk-101, Disperbyk-161, Disperbyk-162, Disperbyk-163, Disperbyk-164, Disperbyk-165, Disperbyk-166, Disperbyk-170, and the like, manufactured by BYK Additives & Instruments; and EFKA series, such as EFKA-47, EFKA-47EA, EFKA-48, EFKA-49, EFKA-100, EFKA-400, EFKA-450, and the like, manufactured by Efka. Examples of the amino-containing dispersant can be used alone or in combinations thereof.

Preferably, the amine value of the amino-containing dispersant ranges from 1 mgKOH/g to 100 mgKOH/g, and more preferably from 10 mgKOH/g to 40 mgKOH/g. The dispersant (F-2) is used in an amount less than 50 parts by weight based on 100 parts by weight of the resin-wrapped black pigment component (F-1).

Dispersing aid may be added to the black pigment dispersion (F) as long as the intended properties of the black pigment dispersion (F) are not impaired. The dispersing aid is adsorbed onto surfaces of the resin-wrapped black pigment component (F-1) and the dispersant (F-2) and serves as an agent to enhance dispersion stability of the resin-wrapped black pigment component (F-1).

Examples of the dispersing aid include, but are not limited to, (1) anionic-type dispersing aid: polycarboxylate type polymeric surfactant, polysulfonate type polymeric surfactant, and the like; (2) nonionic-type dispersing aid: polyoxyethylene, polyoxylene block polymer, and the like; (3) pigment derivatives: pigment derivatives obtained by introducing substituents such as hydroxyl, carboxyl, sulfonic acid group, formamide group, sulfonamide group, and the like into a pigment matrix, wherein examples of the pigment matrix include, but are not limited to, anthraquinone compound, phthalocyanine compound, metal phthalocyanine compound, quinacridone compound, azo chelate compound, azo compound, isoindolinone compound, pyranthrone compound, indanthrone compound, anthrapyrimidine compound, dibromo anthanthrone compound, flavanthrone compound, perylene compound, perinone compound, quinophthalone compound, thioindigo compound, and dioxazine compound. Examples of the dispersing aid can be used alone or in combinations thereof.

(F-3) Second Solvent

There is no specific limitation to amounts of the second solvent (F-3) so long as it can allow the resin-wrapped black pigment component (F-1) to have dispersion stability.

Examples of the second solvent (F-3) include, but are not limited to, (1) glycol acetate type solvent: cellosolve acetate, 3-methoxybutyl acetate, propylene glycol monomethyl ether acetate (abbreviated as PGMEA), 2-methoxyethyl acetate, and the like; (2) compound having ether and ester groups: ethyl 3-ethoxypropionate, propylene glycol monomethyl-ether propionate, and the like; and (3) water. Examples of the second solvent (F-3) can be used alone or in combinations thereof.

Preferably, the photosensitive resin composition also includes a bridging agent (G).

Bridging Agent (G)

The bridging agent is used in an amount ranging from 5 parts by weight to 50 parts by weight based on 100 parts by weight of the alkali-soluble resin (A).

Examples of the bridging agent (G) include, but are not limited to, epoxy polymer, melamine-based compound, guanamine-based compound, compound having hydroxymethyl group, and compound having hydroxymethyl alky ether group. Examples of the bridging agent (G) can be used alone or in combinations thereof.

Examples of the epoxy polymer include, but are not limited to, bisphenol A-based epoxy resin, hydrogenated bisphenol A-based epoxy resin, bisphenol F-based epoxy resin, hydrogenated bisphenol F-based epoxy resin, novolac-based epoxy resin, alicyclic-based epoxy resin, heterocylic-based epoxy resin, glycidyl ester-based resin, glycidyl amine-based resin, epoxidized oil, bromizated derivatives of the aforementioned epoxy resins, tri(glycidyl phenyl)methane, and triglycidyl isocyanurate. Preferably, the epoxy resin is selected from bisphenol A-based epoxy resin, hydrogenated bisphenol A-based epoxy resin, novolac-based epoxy resin, alicyclic-based epoxy resin, glycidyl ester-based resin, glycidyl amine-based resin, tri(glycidylphenyl)methane, and combinations thereof. Commercially available examples of the epoxy polyer include, but are not limited to, EX111, EX201, EX411, and EX901 manufactured by Nagase ChemteX Corporation; EPPN501H manufactured by Nippon Kayaku Co. Ltd.; and EPIKOTE 152 manufactured by Yuka Shell Epoxy. Examples of the epoxy polymer can be used alone or in combinations thereof.

Preferably, the melamine-based compound is represented by formula (VII):

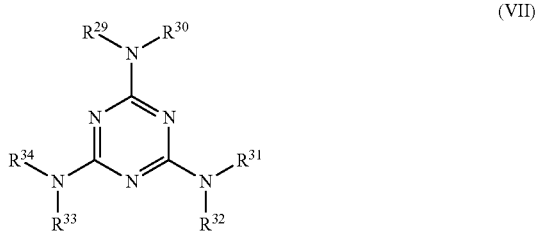

(VII)

wherein $R^{29}$-$R^{34}$ can be the same or different and independently represent aryl, —$CH_2OR^{35}$, or hydrogen; and $R^{35}$ is hydrogen or an alkyl group.

The alkyl group is methyl or ethyl. The aryl group represents phenyl, 1-naphthyl, or 2-naphthyl. The aryl group can be optionally substituted with a substituent selected from the group consisting of a $C_1$-$C_6$ alkyl group, a $C_1$-$C_6$ alkoxy group, halogen, and the like. Examples of the melamine-based compound include, but are not limited to, hexamethylol melamine, pentamethylol melamine, tetramethylol melamine, hexamethoxymethyl melamine, pentamethoxy methyl melamine, tetramethoxy methyl melamine, and hexaethoxy methyl melamine.

Preferably, the guanamine-based compound is represented by formula (VIII):

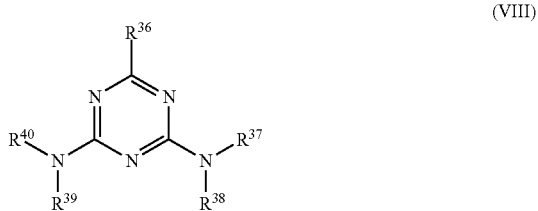

(VIII)

wherein $R^{36}$ represents an aryl group; $R^{37}$-$R^{40}$ can be the same or different and independently represent an aryl group, —$CH_2OR^{41}$, or hydrogen; and $R^{41}$ represents hydrogen or an alkyl group.

The alkyl group is methyl or ethyl. The aryl group represents phenyl, 1-naphthyl, or 2-naphthyl. The aryl group can be optionally substituted with a substituent selected from the group consisting of a $C_1$-$C_6$ alkyl group, a $C_1$-$C_6$ alkoxy group, halogen, and the like. Examples of the guanamine-based compound include, but are not limited to, tetramethylol benzoguanamine, tetramethoxy methyl benzoguanamine, trimethoxy methyl benzoguanamine, and tetraethoxy methyl benzoguanamine.

Examples of the compound having hydroxymethyl group include, but are not limited to, 2,6-bis(hydroxymethyl)-4-methylphenol, 4-tert-butyl-2,6-bis(hydroxymethyl)phenol, 5-ethyl-1,3-bis(hydroxymethyl)-perhydro-1,3,5-triazin e-2-one, dimethyloltrimethyleneurea, 3,5-bis(hydroxymethyl)-perhydro-1,3,5-oxadiazine-4-on e, and tetramethylol glyoxal diolein.

Examples of the compound having hydroxymethyl alkyl ether group include, but are not limited to, 5-ethyl-1,3-bis (methylol methyl ether)-octahydro-1,3,5-triazine-2-one, di(methylol methyl ether)trimethyleneurea, 3,5-bis(methylol methyl ether)-octahydro-1,3,5-oxadiazine-4-one, and tetra(methylol methyl ether)ethanedial diolein.

The bridging agent (G) is used in an amount ranging from 5 parts by weight to 50 parts by weight based on 100 parts by weight of the alkali-soluble resin (A).

(H) Additive

An additive (H) may be added to the photosensitive resin composition as long as the intended properties of the photosensitive resin composition are not impaired. Examples of the additive (H) include, but are not limited to, surfactant, filler, adhesion promoting agent, antioxidant, UV absorbent, anti-coagulant, and a polymer other than the alkali-soluble resin (A) to enhance properties such as mechanical property.

If used, the filler, the adhesion promoting agent, the anti-oxidant, the UV absorbent, the anti-coagulant, and the polymer other than the alkali-soluble resin (A) are respectively used in an amount preferably less than 10 parts by weight and more preferably less than 6 parts by weight based on 100 parts by weight of the alkali-soluble resin (A).

The surfactant is used in an amount preferably less than 6 parts by weight and more preferably less than 4 parts by weight based on 100 parts by weight of the alkali-soluble resin (A).

Preferably, the surfactant is selected from a cationic surfactant, an anionic surfactant, a nonionic surfactant, an amphoteric surfactant, a silicone-based surfactant, a fluorine-based surfactant, and combinations thereof. Examples of the surfactant include, but are not limited to, (1) polyoxyethylene alkyl ethers: polyoxyethylene lauryl ether, polyoxyethylene stearyl ether, polyoxyethylene oleyl ether, and the like; (2) polyoxyethylene alkyl phenyl ethers: polyoxyethylene octyl phenyl ether, polyoxyethylene nonyl phenyl ether, and the like; (3) polyethylene glycol dialkyl esters: polyethylene glycol dilaurate, polyethylene glycol distearate, and the like; (4) sorbitan fatty acid esters; (5) fatty acid modified polyesters; and (6) tertiary amine modified polyurethanes. The aforesaid examples of the surfactant can be used alone or in combinations thereof. Commercially available examples of the surfactant include, but are not limited to, KP manufactured by Shin-Etsu Chemical Industry Co., Ltd., SF-8427 manufactured by Toray Dow Corning Silicon, Polyflow manufactured by Kyoei-Sha Yushi Kagaku Kogyo Co., Ltd., F-Top manufactured by Tochem Product Co., Ltd., Megafac manufactured by Dainippon Chemicals and Ink Co., Ltd., Fluorade manufactured by Sumitomo 3M Co., Ltd., Asahi Guard, Serflon manufactured by Asahi Glass Co., Ltd., and SINOPOL E8008 manufactured by Sino-Japan Chenucal.

Examples of the filler include, but are not limited to, glass and alumina.

Examples of the adhesion-promoting agent include, but are not limited to, vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidyloxy propyltrimethoxysilane, 3-glycidyloxypropylmethyldimethoxysilane, 2-(3,4-epoxycyclohexyl)ethyltrimethoxysilane, 3-chloropropylmethyl dimethoxysilane, 3-chloropropyltrimethoxysilane, 3-methacryloyloxypropyltrimethoxysilane, and 3-mercaptopropyltrimethoxysilane. Examples of the antioxidant include, but are not limited to, 2,2-thiobis(4-methyl-6-t-butylphenol) and 2,6-di-t-butylphenol. Examples of the UV absorbent include, but are not limited to, 2-(3-t-butyl-5-methyl-2-hydroxyphenyl)-5-chlorobenzotriazole, and alkoxybenzophenone. A non-limiting example of the anti-coagulant is sodium polyacrylate.

Black Matrix and Preparation Thereof:

The black matrix is made by applying the photosensitive resin composition of the present invention on a substrate, followed by prebaking, exposing, developing, and postbaking.

Specifically, the black matrix is made as follows. The photosensitive resin composition is applied on a substrate by spin coating, slit coating, and the like, and is then dried under reduced pressure and prebaked to remove the solvent and to form a prebaked coating film on the substrate. The conditions for the drying under reduced pressure and the prebaking depend on the type and the formulating ratio of the components for the photosensitive resin composition. However, the drying under reduced pressure is usually conducted at a pressure less than 200 mmHg for a period ranging from 1 second to 20 seconds, and the prebaking is usually conducted at a temperature ranging from 70° C. to 110° C. for a period ranging from 1 to 15 minutes. The prebaked coating film is exposed via a photomask using ultraviolet light, such as g-line, h-line, i-line, and the like. The device for providing the ultraviolet light includes a (ultra-) high pressure mercury lamp, or a metal halide lamp. The prebaked coating film after exposing is immersed in a developer solution at a temperature of 23±2° C. for a period ranging from 15 seconds to 5 minutes so as to form a desired pattern.

Examples of the developer include, but are not limited to, alkali compounds, such as sodium hydroxide, potassium hydroxide, sodium carbonate, sodium hydrogen carbonate, potassium carbonate, potassium hydrogen carbonate, sodium silicate, sodium methylsilicate, aqueous ammonia, ethylamine, diethylamine, dimethyl ethanolamine, tetramethylammonium hydroxide, tetraethylammonium hydroxide, choline, pyrrole, piperidine, and 1,8-diazabicyclo-[5,4,0]-7-undecene. The concentration of the developer solution ranges preferably from 0.001 wt % to 10 wt %, more preferably from 0.005 wt % to 5 wt %, and most preferably from 0.01 wt % to 1 wt %.

The developer is removed by washing with water after the development. The coating film formed on the substrate is dried with compressed air or nitrogen, and is then post-baked using a heating device, such as a hot plate or an oven. The post-baking is conducted at a temperature ranging from 150° C. to 250° C. for a period ranging from 1 minute to 60 minutes if the hot plate is used or for a period ranging from 5 minutes to 90 minutes if the oven is used. A black matrix is formed on the substrate after the aforementioned process.

Examples of the substrate suitable for the present invention include alkali-free glass, soda-lime glass, Pyrex glass, quartz glass, a glass coated with a transparent conductive film thereon, and the like commonly used in a liquid crystal display; or a photoelectric conversion substrate (for example, a silicon substrate) used in a solid-state image sensor.

Color Filter and Preparation Thereof:

The color filter includes the aforesaid black matrix with surface resistance ranging from $10^{14}$ Ω/cm$^2$ to $10^{17}$ Ω/cm$^2$, and can be made in a manner commonly used in the art. For example, the aforesaid black matrix is formed on a substrate. Red, green, and blue filter segments are then formed on the substrate in the same manner as that for forming the black matrix so as to form a pixel color layer. An indium tin oxide (abbreviated as ITO) film is deposited on the pixel color layer at a temperature ranging from 220° C. to 250° C. under vacuum. The ITO film can be etched and formed with a wiring layout, if necessary. A liquid crystal alignment agent containing polyimide is then applied to form a liquid crystal alignment film. A color filter for a liquid crystal display is thus obtained.

Liquid Crystal Display and Preparation Thereof:

The liquid crystal display includes the aforesaid color filter, and can be made in a manner commonly used in the art. For example, the substrate formed with the color filter and a substrate formed with a thin film transistor are arranged to oppose each other with a space (cell gap). The peripheral portions of the two substrates are joined together with a sealing agent, liquid crystals are filled into the cell gap defined by the surfaces of the substrates and the sealing agent, and an injection hole is sealed up to form a liquid crystal cell. Then, a polarizer is affixed to the exterior sides of the liquid crystal cell to obtain the liquid crystal display device.

The following examples are provided to illustrate the preferred embodiments of the invention, and should not be construed as limiting the scope of the invention.

EXAMPLES

Preparation of Unsaturated-Group-Containing Resin (A-1)

Synthesis Example 1

A 500 ml four-necked flask was added with fluorene epoxy compound (ESF-300 manufactured by Nippon Steel Chemical Co., epoxy equivalent: 231, 100 parts by weight), acrylic acid (30 parts by weight), benzyl triethylammonium chloride (0.3 part by weight), 2,6-di-t-butyl-p-cresol (0.1 part by weight), and propylene glycol monomethyl ether acetate (130 parts by weight) at a controlled feeding rate of 25 parts by weight/min in a continuous manner. A reaction was conducted at a temperature ranging from 100° C. to 110° C. for a period of 15 hours to obtain a yellowish transparent mixture having a solid concentration of 50 wt %.

The yellowish transparent mixture (100 parts by weight) was dissolved in ethylene glycol monoethyl ether acetate (25 parts by weight) while added with tetrahydrophthalic anhydride (6 parts by weight) and benzophenone tetracarboxylic dianhydride (13 parts by weight). A reaction was conducted by heating at a temperature ranging from 110° C. to 115° C. for a period of 2 hours. An unsaturated-group-containing resin (A-1-1) was obtained, which had an acid value of 98.0 mgKOH/g.

Synthesis Example 2

A 500 ml four-necked flask was added with fluorene epoxy compound (ESF-300 manufactured by Nippon Steel Chemical Co., epoxy equivalent: 231, 100 parts by weight), acrylic acid (30 parts by weight), benzyl triethylammonium chloride (0.3 part by weight), 2,6-di-t-butyl-p-cresol (0.1 part by weight), and propylene glycol monomethyl ether acetate (130 parts by weight) at a controlled feeding rate of 25 parts by weight/min in a continuous manner. A reaction was conducted at a temperature ranging from 100° C. to 110° C. for a period of 15 hours to obtain a yellowish transparent mixture having a solid concentration of 50 wt %.

The yellowish transparent mixture (100 parts by weight) was dissolved in ethylene glycol monoethyl ether acetate (25 parts by weight) while added with benzophenone tetracarboxylic dianhydride (13 parts by weight). A reaction was conducted by heating at a temperature ranging from 90° C. to 95° C. for a period of 2 hours. Tetrahydrophthalic anhydride (6 parts by weight) was then added. A further reaction was conducted at a temperature ranging from 90° C. to 95° C. for a period of 4 hours. An unsaturated-group-containing resin (A-1-2) was obtained, which had an acid value of 99.0 mgKOH/g.

Synthesis Example 3

An epoxy compound (NC-3000 manufactured by Nippon Kayaku Co. Ltd., epoxy equivalent: 288, 400 parts by weight), acrylic acid (102 parts by weight), p-methoxyphenol (0.3 part by weight), triphenyl phosphine (5 parts by weight), and propylene glycol monomethyl ether acetate (264 parts by weight) were reacted in a reactor at a temperature of 95° C. for a period of 9 hours to obtain an intermediate product having an acid value of 2.2 mgKOH/g. Tetrahydrophthalic anhydride (151 parts by weight) was then added. A further reaction was conducted at a temperature of 95° C. for a period of 4 hours. An unsaturated-group-containing resin (A-1-3) was obtained, which had an acid value of 102 mgKOH/g and a weight average molecular weight of 3,200.

Preparation of Other Alkali-Soluble Resin (A-2)

Synthesis Example 4

A round-bottomed flask installed with a stirrer and a condenser and purged with nitrogen was added with 2,2'-azobisisobutyronitrile (1 part by weight), propylene glycol monomethyl ether acetate (240 parts by weight), methacrylic acid (20 parts by weight), styrene (15 parts by weight), benzoyl methacrylate (35 parts by weigh), glyceryl monomethytl acrylate (10 parts by weight), and N-phenyl maleimide (20 parts by weight). The temperature was raised to 80° C. with slow stirring to obtain a homogeneous mixture. A polymerization reaction was conducted for a period of 4 hours. The temperature was further raised to 100° C., and additional 2,2'-azobisisobutyronitrile (0.5 part by weight) was added. A further polymerization reaction was conducted for a period of 1 hour to obtain an alkali-soluble resin (A-2-1).

Synthesis Example 5

A round-bottomed flask installed with a stirrer and a condenser and purged with nitrogen was added with 2,2'-azobisisobutyronitrile (2 parts by weight), propylene glycol monomethyl ether (300 parts by weight), methacrylic acid (15 parts by weight), 2-hydroxyethyl acrylate (15 parts by weight), and benzoyl methacrylate (70 parts by weight). The temperature was raised to 80° C. with slow stirring to obtain a homogeneous mixture. A polymerization reaction was conducted for a period of 3 hours. The temperature was further raised to 100° C., and additional 2,2'-azobisisobutyronitrile (0.5 part by weight) was added. A further polymerization reaction was conducted for a period of 1 hour to obtain an alkali-soluble resin (A-2-2).

Preparation of Polysiloxane (B)

Synthesis Example 6

A 500 ml three-necked flask was added with propylene glycol monoethyl ether (100 g). Stirring was conducted at room temperature while a solution of a silane monomer mixture and an oxalic acid aqueous solution were continuously added. The solution of the silane monomer mixture was prepared by dissolving dimethyldimethoxysilane (84 g, 0.7 mole) and phenyltrimethoxy silane (59.4 g, 0.3 mole) in propylene glycol monoethyl ether (80 g). The oxalic acid aqueous solution was prepared by dissolving oxalic acid (0.15 g) in water (30 g). The mixture in the flask was then stirred in an oil bath at a temperature of 30° C. for 30 minutes. The temperature of the oil bath was raised to 120° C. within a succeeding 30 minutes until the temperature of the mixture in the flask reached 105° C. The mixture in the flask was stirred for a further 2 hours to obtain polysiloxane (B-1) via polycondensation. Methanol (73 g) and water (16 g) produced as by-products were separated by distillation.

Synthesis Example 7

A 500 ml three-necked flask was added with dimethyldimethoxysilane (78.0 g, 0.65 mole), phenyltrimethoxysilane (63.4 g, 0.32 mole), 3-triethoxysilylpropyl butanedioic anhydride (commercially available as GF-20, 9.1 g, 0.03 mole), and propylene glycol monoethyl ether (200 g). Stirring was conducted at room temperature while an oxalic acid aqueous solution (0.25 g oxalic acid/75 g $H_2O$) was added over 30 minutes. The mixture in the flask was then stirred in an oil bath at a temperature of 30° C. for 30 minutes. The temperature of the oil bath was raised to 120° C. within a succeeding 30 minutes until the temperature of the mixture in the flask reached 100° C. The mixture in the flask was stirred for a further 5 hours to conduct polycondensation. The reaction solution in the flask was cooled to room temperature. Acetone (2,000 g) was added and the solution in the flask was stirred for a further 30 minutes. Precipitate was removed from the solution via filtration to obtain a filtrate. The solvent contained in the filtrate was removed via distillation to obtain polysiloxane (B-2).

Synthesis Example 8

A 500 ml three-necked flask was added with propylene glycol monoethyl ether (100 g). Stirring was conducted at room temperature while a solution of a silane monomer mixture and an oxalic acid aqueous solution were continuously added. The solution of the silane monomer mixture was prepared by dissolving methyltrimethoxysilane (81.6 g, 0.6 mole) and phenyltrimethoxysilane (79.2 g, 0.4 mole) in propylene glycol monoethyl ether (80 g). The oxalic acid aqueous solution was prepared by dissolving oxalic acid (0.1 g) in water (30 g). The mixture in the flask was then stirred in an oil bath at a temperature of 30° C. for 30 minutes. The temperature of the oil bath was raised to 120° C. within a succeeding 30 minutes until the temperature of the mixture in the flask reached 105° C. The mixture in the flask was stirred for a further 2 hours to obtain polysiloxane (B-3) via polycondensation. Methanol (96 g) and water (24 g) produced as by-products were separated by distillation.

Preparation of Resin-Wrapped Black Pigment Component (F-1)

Synthesis Example 9

100 parts by weight of carbon black (commercially available as MA220, manufactured by Mitsubishi Chemical corp.) and 3,000 parts by weight of water were mixed together and blended into a slurry. The slurry was then added with 10 parts by weight of resin for wrapping black pigment (epoxy resin, commercially available as EPIKOTE 828, manufactured by Yuka Shell Epoxy Co., Ltd.) and 150 parts by weight of toluene followed by homogeneous mixing. 0.5 part by weight of 2-ethyl-4-methylimidazole was slowly dropped into the mixture. Water was removed by filtration commonly known in the art. The obtained filter cake is resin-wrapped black pigment component (F-1) and can be optionally dried.

Synthesis Examples 10 to 13

Synthesis Examples 10 to 13 were conducted in a manner identical to that of Synthesis Example 9 to synthesize the resin-wrapped black pigment component (F-1) with differences in types and amounts of the black pigment, resin for wrapping the black pigment, curing agent, and the third solvent as illustrated in Table 1.

Preparation of Black Pigment Dispersion (F)

Preparation Example F-a 100 parts by weight of the resin-wrapped black pigment component (F-1) obtained in Synthesis Example 9, 10 parts by weight of Disperbyk-161, and 50 parts by weight of propylene glycol monomethyl ether acetate were mixed together and added with glass beads followed by mixing using a ball mill.

Preparation Examples F-b to F-e

Preparation examples F-b to F-e were conducted in a manner identical to that of Preparation Example F-a to prepare the black pigment dispersion (F) with differences in types and amounts of the resin-wrapped black pigment component (F-1), dispersant (F-2), and the second solvent (F-3) as illustrated in Table 2.

Preparation Example F-f 100 parts by weight of carbon black (commercially available as MA220, manufactured by Mitsubishi Chemical corp.), 10 parts by weight of SOLSPERSE 24000GR, and 250 parts by weight of propylene glycol monomethyl ether acetate were mixed together and added with glass beads followed by mixing using a ball mill.

Preparation Example F-g 100 parts by weight of carbon black (commercially available as MA220, manufactured by Mitsubishi Chemical corp.) and 250 parts by weight of ethyl 3-ethoxypropionate were mixed together and added with glass beads followed by mixing using a ball mill.

Preparation of Photosensitive Resin Composition

Example 1

100 parts by weight of the unsaturated-group-containing resin (A-1-1) obtained in Synthesis Example 1, 24 parts by weight of the polysiloxane (B-1) obtained in Synthesis Example 6, 50 parts by weight of dipentaerythritol hexaacrylate (referred to as C-1), 20 parts by weight of ethanone, 1-[9-ethyl-6-(2-methylbenzoyl) 9H-carbazole-3-yl]-,1-(O-acetyl oxime) (referred to as D-1), 840 parts by weight of the black pigment (F-1) obtained in Preparation Example F-a, and 1000 parts by weight of propylene glycol monomethyl ether acetate were mixed in a swing-out stirrer to obtain a homogeneous dispersion.

Examples 2 to 12 and Comparative Examples 1 to 6

Examples 2 to 12 and Comparative Examples 1 to 6 were conducted in a manner identical to that of Example 1 using the components and the amounts thereof shown in Tables 3 and 4.

The photosensitive resin compositions of Examples 1 to 12 and Comparative Examples 1 to 6 were evaluated according to the following evaluation methods. The evaluation results are shown in Tables 3 and 4.

Preparation of Black Matrix

Application Example 1

The photosensitive resin composition obtained in Example 1 was spin-coated on a glass substrate of 100 mm×100 mm using a coater (commercially available as MS-A150, from Shinkuang Trading Co., Ltd.), followed by drying in a reduced pressure of 100 mmHg for 5 seconds, and then pre-baking in an oven at a temperature of 85° C. for 3 minutes to form a prebaked film having a thickness of 2.2 μm.

The prebaked film was treated with ultra-violet irradiation using an exposure machine (Model No. AG500-4N, manufactured by M & R Nano Technology, 200 mJ/cm$^2$) through a photo-mask. The pre-baked film after the ultra-violet irradiation was immersed in a developer (0.04% potassium hydroxide solution) at 23° C. for 2 minutes, followed by washing with water and then post-baking in an oven at 200° C. for 40 minutes to obtain a black matrix having a thickness of 2.0 μm.

Application Examples 2-12 and Comparative Application Examples 1-6

Examples 2 to 12 and Comparative Examples 1 to 6 were conducted in a manner identical to that of Application Example 1 using the components and the amounts thereof shown in Tables 3 and 4.
Evaluation Methods:
1. Surface Resistance:
The photosensitive resin compositions obtained in Examples 1 to 12 and Comparative Examples 1 to 6 were separately spin-coated on glass substrates of 100 mm×100 mm using a coater, followed by drying in a reduced pressure of 100 mmHg for 5 seconds, and then prebaking in an oven at a temperature of 100° C. for 2 minutes to form a prebaked film having a thickness of 1.2 μm. The prebaked films were treated with ultra-violet irradiation using an exposure machine (100 mJ/cm$^2$) through a photo-mask. The pre-baked films after the ultra-violet irradiation were immersed in a developer (0.04% potassium hydroxide solution) at 23° C. for 2 minutes, followed by washing with water and then post-baking in an oven at 230° C. for 60 minutes to obtain black matrices having a thickness of 1.0 um. Three surface resistance values were measured at three measuring points of each of the aforesaid black matrices using a high resistance meter (commercially available as MCP-HT450 type Hiresta-UP, manufactured by Mitsubishi Chemical Corporation). An average value was calculated from the three measured surface resistance values as the surface resistance ($\Omega/cm^2$).
2. Stability of Surface Resistance after Heat Treatment:
Three surface resistance values were measured at three measuring points of each of the aforesaid prebaked films using the high resistance meter. An average value ($\Omega_1$) was calculated from the three measured surface resistance values.

Each of the prebaked films was treated with ultra-violet irradiation (100 mJ/cm$^2$) through a photo-mask. Each of the pre-baked films after the ultra-violet irradiation was immersed in a developer (0.04% potassium hydroxide solution) at 23° C. for 2 minutes, followed by washing with water and then post-baking in an oven at 300° C. for 180 minutes to obtain a black matrix. Three surface resistance values were measured at the same three measuring points of each of the black matrices using the high resistance meter. An average value ($\Omega_2$) was calculated from the three measured surface resistance values. Stability of surface resistance was determined using the following formula:

Stability of surface resistance ($R_H$)=($\Omega_2/\Omega_1$)×100%

◎: $R_H$>97%;
○: 97%≥$R_H$>95%;
Δ: 95%≥$R_H$>90%;
X: $R_H$≤90%.
3. Stability of Surface Resistance after Plasma Treatment:
The photosensitive resin compositions obtained in Examples 1 to 12 and Comparative Examples 1 to 6 were separately spin-coated on glass substrates of 100 mm×100 mm using a coater, followed by drying in a reduced pressure of 100 mmHg for 5 seconds, and then prebaking in an oven at a temperature of 100° C. for 2 minutes to form a prebaked film having a thickness of 1.2 μm. The prebaked films were treated with ultra-violet irradiation using an exposure machine (100 mJ/cm$^2$) through a photo-mask. The pre-baked films after the ultra-violet irradiation were immersed in a developer (0.04% potassium hydroxide solution) at 23° C. for 2 minutes, followed by washing with water and then post-baking in an oven at 230° C. for 60 minutes to obtain black matrices having a thickness of 1.0 μm. Three surface resistance values were measured at three measuring points of each of the aforesaid black matrices using a high resistance meter (commercially available as MCP-HT450 type Hiresta-UP, manufactured by Mitsubishi Chemical Corporation). An average value was calculated from the three measured surface resistance values as the surface resistance ($\Omega_1$).

Each of the black matrices was treated with plasma of 2K Hz (plasma equipment model no. AS2002, manufactured by Nano Electronics and Micro System Technologies, Inc) for 20 minutes. Three surface resistance values were measured at the same three measuring points of each of the black matrices using the high resistance meter. An average value ($Q\Omega_2$) was calculated from the three measured surface resistance values. Stability of surface resistance was determined using the following formula:

Stability of surface resistance $(R_P) = (\Omega_2/\Omega_1) \times 100\%$

⊚: $R_H > 97\%$;
○: $97\% \geq R_H > 95\%$;
Δ: $95\% \geq R_H > 90\%$;
X: $R_H \leq 90\%$.

TABLE 1

| Resin-wrapped Black Pigment Component (F-1) | | Synthesis Examples | | | | |
|---|---|---|---|---|---|---|
| | | 9 | 10 | 11 | 12 | 13 |
| Black Pigment | MA220 | 100 | — | 50 | — | 100 |
| | MA230 | — | 100 | 50 | 100 | — |
| Water | | 3000 | 3000 | 3000 | 3000 | 3000 |
| Resin for Wrapping Black Pigment | EPIKOTE 828 | 10 | 15 | — | — | 50 |
| | EPIKOTE 630 | — | 5 | 25 | 40 | — |
| Curing Agent | EMMI | 0.5 | — | 10 | — | 2 |
| | PIM | — | — | — | 3 | 3 |
| Third Solvent | Toluene | 150 | 200 | — | 350 | — |
| | Cyclo-hexanone | — | — | 250 | — | 400 |
| Average Diameter (mm) | | 1.2 | 1.5 | 1.5 | 2.0 | 2.2 |

MA220: carbon black manufactured by Mitsubishi Chemical Corporation;
MA230: carbon black manufactured by Mitsubishi Chemical Corporation;
EPIKOTE 828: epoxy resin manufactured by Yuka Shell Epoxy;
EPIKOTE 630: epoxy resin manufactured by Yuka Shell Epoxy;
EMMI: 2-ethyl-4-methylimidazole;
PIM: 2-phenylimidazole.

TABLE 2

| Black Pigment Dispersion (F) | | Preparation Examples | | | | | | |
|---|---|---|---|---|---|---|---|---|
| | | F-a | F-b | F-c | F-d | F-e | F-f | F-g |
| Resin-Wrapped Black Pigment Component (F-1) | Syn. Exp. 9 | 100 | — | — | — | — | — | — |
| | Syn. Exp. 10 | — | 100 | — | — | — | — | — |
| | Syn. Exp. 11 | — | — | 100 | — | — | — | — |
| | Syn. Exp. 12 | — | — | — | 100 | — | — | — |
| | Syn. Exp. 13 | — | — | — | — | 100 | — | — |
| Black Pigment without Resin Wrapping | MA220 | — | — | — | — | — | 100 | 100 |
| Dispersant (F-2) | Disperbyk-161 | 10 | — | 15 | — | 50 | — | — |
| | SOLSPERSE 24000GR | — | 2 | — | 30 | — | 10 | — |
| Second Solvent (F-3) | PGMEA | 50 | — | 250 | — | 500 | 250 | — |
| | EEP | — | 100 | — | 400 | — | — | 250 |
| Solid Constituent | | 68.8 | 50.5 | 31.5 | 24.5 | 23.1 | 30.6 | 28.6 |

Disperbyk-161: manufactured by BYK Additives and Instruments;
SOLSPERSE 24000GR: manufactured by Avecia;
PGMEA: propylene glycol monomethyl ether acetate;
EEP: ethyl 3-ethoxypropionate.

TABLE 3

| Components Parts by weight | | Examples | | | | | | | | | |
|---|---|---|---|---|---|---|---|---|---|---|---|
| | | 1 | 2 | 3 | 4 | 5 | 6 | 7 | 8 | 9 | 10 |
| Alkali-soluble Resin (A) | A-1-1 | 100 | — | — | 90 | — | 30 | — | — | — | 100 |
| | A-1-2 | — | 100 | — | — | 80 | — | — | — | 100 | — |
| | A-1-3 | — | — | 100 | — | — | — | 50 | 30 | — | — |
| | A-2-1 | — | — | — | 10 | — | 70 | — | — | — | — |
| | A-2-2 | — | — | — | — | 20 | — | 50 | 70 | — | — |
| Polysiloxane (B) | B-1 | 24 | — | — | 25 | 20 | — | — | 20 | — | — |
| | B-2 | — | 50 | — | — | — | 20 | 20 | — | 45 | — |
| | B-3 | — | — | 200 | — | 5 | 20 | — | — | — | 80 |

TABLE 3-continued

| Components | | Examples | | | | | | | | | |
|---|---|---|---|---|---|---|---|---|---|---|---|
| Parts by weight | | 1 | 2 | 3 | 4 | 5 | 6 | 7 | 8 | 9 | 10 |
| Ethylenically Unsaturated Compound (C) | C-1 | 50 | 100 | 100 | 100 | — | — | 120 | 100 | 50 | — |
| | C-2 | — | — | 50 | 100 | 100 | 200 | — | — | 100 | — |
| Photo-initiator (D) | D-1 | 20 | 30 | 30 | 30 | 20 | 30 | 20 | 30 | 30 | — |
| | D-2 | — | — | 10 | 20 | — | — | 10 | — | 10 | — |
| First Solvent (E) | E-1 | 1000 | 1500 | 500 | — | 1000 | — | 1500 | 2000 | 500 | 1000 |
| | E-2 | — | — | 1000 | 2000 | 1000 | 1500 | 1000 | — | 1500 | 1000 |
| Black Pigment Dispersion (F) | F-a | 840 | — | — | — | — | — | 300 | — | — | 400 |
| | F-b | — | 500 | — | — | — | 300 | — | 150 | — | — |
| | F-c | — | — | 1000 | — | — | — | — | — | 300 | 400 |
| | F-d | — | — | — | 500 | — | 300 | — | — | 300 | — |
| | F-e | — | — | — | — | 200 | — | — | 300 | — | — |
| Bridging Agent (G) | G-1 | — | 20 | — | — | — | — | — | — | — | — |
| | G-2 | — | — | — | 15 | — | — | — | — | 30 | — |
| (A-1)/(B) Ratio | | 4.2 | 2.0 | 0.5 | 3.6 | 3.2 | 0.8 | 2.5 | 1.5 | 2.2 | 1.3 |
| (F)/(B) Ratio | | 35.0 | 10.0 | 5.0 | 20.0 | 8.0 | 15.0 | 15.0 | 22.5 | 13.3 | 10.0 |
| Evaluation results | Surface Resistance | $2.3 \times 10^{14}$ | $7.8 \times 10^{14}$ | $4.7 \times 10^{14}$ | $3.4 \times 10^{16}$ | $8.8 \times 10^{16}$ | $2.1 \times 10^{15}$ | $8.6 \times 10^{14}$ | $7.3 \times 10^{15}$ | $5.4 \times 10^{15}$ | $2.6 \times 10^{14}$ |
| | $R_H$ | ○ | ◎ | ○ | ◎ | ○ | ○ | ○ | ○ | ◎ | ○ |
| | $R_P$ | ◎ | ◎ | ◎ | ◎ | ◎ | ◎ | ◎ | ◎ | ◎ | ◎ |

C-1: dipentaerythritol hexaacrylate;
C-2: dipentaerythritol tetraacrylate;
D-1: ethanone, 1-[9-ethyl-6-(2-methylbenzoyl)9H-carbazole-3-yl]-,1-(O-acetyl oxime);
D-2: 2-benzyl-2-N,N-dimethylamino-1-(4-morpholinophenyl)-1-butanone;
E-1: propylene glycol monomethyl ether acetate;
E-2: ethyl 3-ethoxypropionate;
G-1: EPPN501H manufactured by Nippon Kayaku Co. Ltd.;
G-2: EPIKOTE 152 manufactured by Yuka Shell Epoxy Co., Ltd.

TABLE 4

| Components | | Examples | | Comparative Examples | | | | | |
|---|---|---|---|---|---|---|---|---|---|
| Parts by weight | | 11 | 12 | 1 | 2 | 3 | 4 | 5 | 6 |
| Alkali-soluble Resin (A) | A-1-1 | — | — | — | 100 | — | — | 70 | 70 |
| | A-1-2 | — | — | — | — | 100 | 100 | — | — |
| | A-1-3 | 100 | 100 | — | — | — | — | — | — |
| | A-2-1 | — | — | 100 | — | — | — | 30 | 30 |
| | A-2-2 | — | — | — | — | — | — | — | — |
| Polysiloxane (B) | B-1 | — | 20 | 50 | — | 30 | — | — | — |
| | B-2 | 250 | — | — | — | — | 30 | — | — |
| | B-3 | — | — | — | — | — | — | 100 | 20 |
| Ethylenically Unsaturated Compound (C) | C-1 | 100 | 100 | 100 | 100 | 100 | 100 | 150 | 150 |
| | C-2 | 20 | 20 | — | — | — | — | — | — |
| Photo-initiator (D) | D-1 | 30 | 30 | 30 | 30 | 30 | 30 | 50 | 50 |
| | D-2 | — | — | — | — | — | — | — | — |
| First Solvent (E) | E-1 | 1000 | 1000 | 1000 | 1000 | 1500 | 1500 | 1000 | 1000 |
| | E-2 | 500 | 500 | — | — | — | — | 1000 | 1000 |
| Black Pigment Dispersion (F) | F-a | — | — | 800 | 800 | — | — | — | — |
| | F-b | 1500 | — | — | — | — | — | — | — |
| | F-c | — | — | — | — | — | — | 300 | — |
| | F-d | — | 500 | — | — | — | — | — | — |
| | F-e | — | — | — | — | — | — | — | 800 |
| | F-f | — | — | — | — | — | 800 | — | — |
| | F-g | — | — | — | — | 800 | — | — | — |
| Bridging Agent (G) | G-1 | — | — | — | — | — | — | — | — |
| | G-2 | — | — | — | — | — | — | — | — |
| (A-1)/(B) Ratio | | 0.4 | 5.0 | 0 | — | 3.3 | 3.3 | 0.7 | 3.5 |
| (F)/(B) Ratio | | 6.0 | 25.0 | 16.0 | — | 26.7 | 26.7 | 3.0 | 40.0 |
| Evaluation results | Surface Resistance | $1.5 \times 10^{14}$ | $1.7 \times 10^{15}$ | $1.1 \times 10^{14}$ | $1.3 \times 10^{14}$ | $2.3 \times 10^{10}$ | $1.7 \times 10^{10}$ | $3.2 \times 10^{14}$ | $5.6 \times 10^{14}$ |
| | $R_H$ | ○ | ○ | X | X | Δ | Δ | X | Δ |
| | $R_P$ | ○ | ○ | X | X | X | X | X | X |

C-1: dipentaerythritol hexaacrylate;
C-2: dipentaerythritol tetraacrylate;
D-1: ethanone, 1-[9-ethyl-6-(2-methylbenzoyl)9H-carbazole-3-yl]-,1-(O-acetyl oxime);
D-2: 2-benzyl-2-N,N-dimethylamino-1-(4-morpholinophenyl)-1-butanone;
E-1: propylene glycol monomethyl ether acetate;
E-2: ethyl 3-ethoxypropionate;
G-1: EPPN501H manufactured by Nippon Kayaku Co. Ltd.;
G-2: EPIKOTE 152 manufactured by Yuka Shell Epoxy Co., Ltd.

As shown in Table 1, the photosensitive resin compositions obtained in Examples 1-12 have a weight ratio of the black pigment dispersion (F) to the polysiloxane (B) (referred to as (F)/(B) ratio) ranging from 5 to 35, and the black matrices formed from the photosensitive resin compositions have good stability of surface resistance after heat and plasma treatments.

According to the result of Comparative Example 1, the photosensitive resin composition was formed merely with the other alkali-soluble resin (A-2) and the polysiloxane (B), and without using the unsaturated-group-containing resin (A-1). The black matrix formed from the photosensitive resin composition has inferior stability of surface resistance after heat and plasma treatments.

According to the result of Comparative Example 2, the photosensitive resin composition was formed without using the polysiloxane (B). The black matrix formed from the photosensitive resin composition has inferior stability of surface resistance after heat and plasma treatments.

According to the results of Comparative Examples 3 and 4, the photosensitive resin compositions were formed without using the resin-wrapped black pigment component (F-1). The black matrices formed from the photosensitive resin compositions have inferior stability of surface resistance after heat and plasma treatments.

According to the results of Comparative Examples 5 and 6, the photosensitive resin compositions respectively have (F)/(B) ratios of 3 and 40. The black matrices formed from the photosensitive resin compositions have inferior stability of surface resistance after heat and plasma treatments. Therefore, the black matrix can have superior stability of surface resistance by adjusting the (F)/(B) ratio.

In view of the aforesaid, the black matrix can have better stability of surface resistance after heat and plasma treatments by having the black pigment dispersion (F) and the polysiloxane (B) in the photosensitive resin composition along with adjusting the (F)/(B) ratio to be within the range of 5 to 35.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A photosensitive resin composition, comprising:
   (A) an alkali-soluble resin including an unsaturated-group-containing resin (A-1) obtained by subjecting a mixture containing (i) an epoxy compound having at least two epoxy groups and (ii) a compound having at least one carboxyl group and at least one ethylenically unsaturated group to polymerization;
   (B) a polysiloxane;
   (C) an ethylenically unsaturated compound;
   (D) a photo-initiator;
   (E) a first solvent; and
   (F) a black pigment dispersion including a resin-wrapped black pigment component (F-1), a dispersant (F-2), and a second solvent (F-3),
   wherein a weight ratio of said black pigment dispersion (F) to said polysiloxane (B) ranges from 5 to 35, and wherein said polysiloxane (B) is obtained by subjecting a silane monomer or a combination of said silane monomer and a siloxane prepolymer to hydrolysis and partial condensation, and said silane monomer is represented by formula (V):

$$SiR^{21}_{m}(OR^{22})_{4-m} \ (V),$$

wherein m is an integer ranging from 1 to 3, $R^{21}$ independently represents a hydrogen, a substituted or unsubstituted C1-C10 alkyl group, a substituted or unsubstituted C2-C10 alkenyl group, or a substituted or unsubstituted C6-C15 aryl group, and wherein at least one of $R^{21}$ is selected from the group consisting of 3-glutaric anhydride propyl, 3-butanedioic anhydride propyl, and 2-butanedioic anhydride ethyl, and $R^{22}$ independently represents a hydrogen, a substituted or unsubstituted C1-C6 alkyl group, a substituted or unsubstituted C1-C6 acyl group, or a substituted or unsubstituted C6-C15 aryl group.

2. The photosensitive resin composition according to claim 1, wherein a weight ratio of said unsaturated-group-containing resin (A-1) to said polysiloxane (B) ranges from 0.5 to 4.2.

3. The photosensitive resin composition as according to claim 2, wherein said weight ratio of said unsaturated-group-containing resin (A-1) to said polysiloxane (B) ranges from 0.8 to 4.0.

4. The photosensitive resin composition according to claim 1, wherein said weight ratio of said black pigment dispersion (F) to said polysiloxane (B) ranges from 6 to 32.

5. The photosensitive resin composition as claimed in claim 1, wherein said epoxy compound (i) is represented by formula (I):

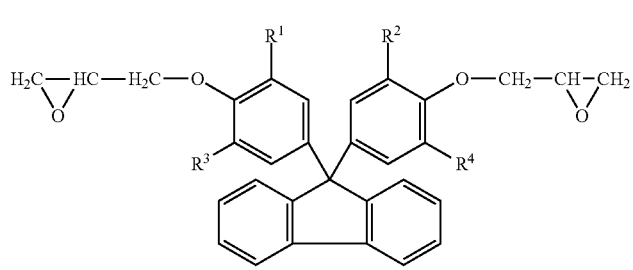

(I)

wherein $R^1$, $R^2$, $R^3$, and $R^4$ are independently selected from the group consisting of hydrogen, halogen, a $C_1$-$C_5$ alkyl group, a $C_1$-$C_5$ alkoxy group, a $C_6$-$C_{12}$ aryl group, and a $C_6$-$C_{12}$ aralkyl group.

6. The photosensitive resin composition as claimed in claim 1, wherein said epoxy compound (i) is represented by formula (II):

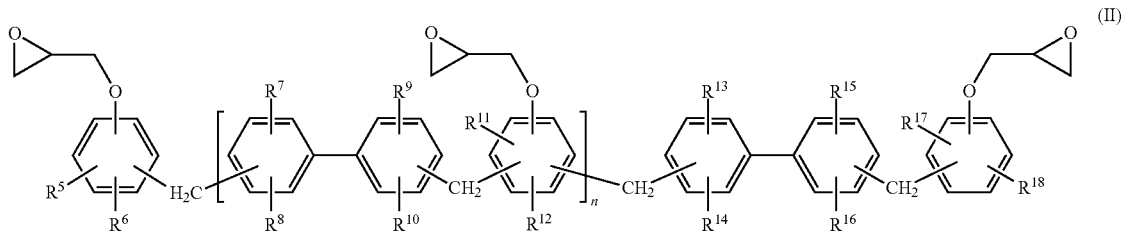

wherein $R^5$-$R^{18}$ are independently selected from the group consisting of hydrogen, halogen, a $C_1$-$C_8$ alkyl group, and a $C_6$-$C_{15}$ aryl group; and n represents an integer ranging from 0 to 10.

7. The photosensitive resin composition as according to claim 1, wherein said resin-wrapped black pigment component (F-1) is prepared from a combination including a black pigment, a resin for wrapping said black pigment, and a third solvent.

8. The photosensitive resin composition according to claim 7, wherein said resin includes an epoxy resin.

9. The photosensitive resin composition according to claim 7, wherein said combination further includes a curing agent.

10. The photosensitive resin composition according to claim 9, wherein said curing agent includes an imidazole compound.

11. The photosensitive resin composition according to claim 7, wherein said resin is in an amount ranging from 10 to 50 parts by weight based on 100 parts by weight of said black pigment.

12. The photosensitive resin composition according to claim 1, wherein said dispersant (F-2) is in an amount ranging from 2 to 50 parts by weight, and said second solvent (F-3) is in an amount ranging from 2 to 500 parts by weight based on 100 parts by weight of said resin-wrapped black pigment component (F-1).

13. The photosensitive resin composition according to claim 1, wherein said unsaturated-group-containing resin (A-1) is in an amount ranging from 30 to 100 parts by weight, said polysiloxane (B) is in an amount ranging from 20 to 200 parts by weight, said ethylenically unsaturated compound (C) is in an amount ranging from 2 to 220 parts by weight, said first solvent (E) is in an amount ranging from 300 to 3,000 parts by weight, and said black pigment dispersion (F) is in an amount ranging from 300 to 1,500 parts by weight based on 100 parts by weight of said alkali-soluble resin (A).

14. The photosensitive resin composition according to-claim 1, wherein said photo-initiator (D) is in an amount ranging from 2 to 120 parts by weight based on 100 parts by weight of said ethylenically unsaturated compound (C).

15. The photosensitive resin composition according to claim 1, further comprising (G) a bridging agent.

16. The photosensitive resin composition according to claim 15, wherein said bridging agent (G) is in amount ranging from 5 to 50 parts by weight based on 100 parts by weight of said alkali-soluble resin (A).

17. A black matrix formed from the photosensitive resin composition as claimed in claim 1.

18. A color filter comprising the black matrix according to claim 17, wherein said black matrix has a surface resistance ranging from $10^{14}$ $\Omega$/cm² to $10^{17}$ $\Omega$/cm².

19. A liquid crystal display device comprising the color filter as claimed in claim 18.

\* \* \* \* \*